United States Patent
Wen et al.

(10) Patent No.: US 9,035,015 B1
(45) Date of Patent: May 19, 2015

(54) PHOTOVOLTAIC CELL CONTAINING NOVEL PHOTOACTIVE POLYMER

(71) Applicant: Merck Patent GmbH, Darmstadt (DE)

(72) Inventors: Li Wen, Woodbury, MN (US); David P. Waller, Lexington, MA (US); Paul Byrne, Morristown, PA (US); Nicolas Drolet, Tewksbury, MA (US); Gilles Herve Regis Dennler, Tewksbury, MA (US); Kap-Soo Cheon, Shrewsbury, MA (US)

(73) Assignee: MERCK PATENT GmbH, Darmstadt (DE)

( * ) Notice: Subject to any disclaimer, the term of this patent is extended or adjusted under 35 U.S.C. 154(b) by 0 days.

(21) Appl. No.: 14/601,693

(22) Filed: Jan. 21, 2015

Related U.S. Application Data

(60) Division of application No. 13/777,183, filed on Feb. 26, 2013, which is a continuation of application No. PCT/US2011/049942, filed on Aug. 31, 2011.

(60) Provisional application No. 61/379,563, filed on Sep. 2, 2010.

(51) Int. Cl.
  *C08G 75/00* (2006.01)
  *H01L 51/00* (2006.01)
  *C08G 75/02* (2006.01)
  *C08G 75/32* (2006.01)

(52) U.S. Cl.
  CPC ........ *H01L 51/0036* (2013.01); *C08G 75/0209* (2013.01); *C08G 75/32* (2013.01)

(58) Field of Classification Search
  CPC ...................................... C08F 14/18
  USPC ..................... 528/377, 380, 373, 37; 136/261
  See application file for complete search history.

(56) References Cited

U.S. PATENT DOCUMENTS

| | | | |
|---|---|---|---|
| 6,297,351 B1 * | 10/2001 | Murayama et al. | 528/401 |
| 7,524,922 B2 | 4/2009 | Heeney et al. | |
| 7,605,225 B2 | 10/2009 | Marks et al. | |
| 2005/0082525 A1 * | 4/2005 | Heeney et al. | 257/40 |
| 2007/0131270 A1 | 6/2007 | Gaudiana et al. | |
| 2007/0154704 A1 | 7/2007 | Debergalis et al. | |
| 2007/0282094 A1 * | 12/2007 | Marks et al. | 528/377 |
| 2008/0087324 A1 | 4/2008 | Gaudiana et al. | |

FOREIGN PATENT DOCUMENTS

| | | |
|---|---|---|
| WO | WO 2004/100282 A2 | 11/2004 |
| WO | WO 2008/067023 A2 | 6/2008 |
| WO | WO 2010/043665 A1 | 4/2010 |

OTHER PUBLICATIONS

Kameshima et al., Journal of Polymer Science: Part A: Polymer Chemistry, vol. 39, 3143-3150 (2001).*

Yongfeng Wang et al., "Bithiophene-Perfluorobanzene Copolymers", "Bithiophene-Perfluorobenzene Copolymers". Macromolecules, vol. 41, No. 22, Nov. 25, 2008, pp. 6643-8647.

(Continued)

*Primary Examiner* — Shane Fang
(74) *Attorney, Agent, or Firm* — Bowditch & Dewey, LLP; Roger P Zimmerman

(57) ABSTRACT

Novel photoactive polymers, as well as related photovoltaic cells, articles, systems, and methods, are disclosed.

24 Claims, 3 Drawing Sheets

(56) References Cited

OTHER PUBLICATIONS

Zhenhua Zhang et al. "Copolymers from benzodithiophene and benotriazole: synthesis and photovoltaic applications", Polymer Chemistry, vol. 1, No. 9, Jan. 1, 2010, p. 1441, XP55009411.

International Preliminary Report on Patentability in counterpart international application PCT/US2011/049942.
Akcelrud et al. Polymer, vol. 45, (2004), pp. 7071-7081.
Kameshima et al., Journal of Polymer Sciense: Part A: Polymer Chemistry, vol. 39, pp. 3143-3150 (2001).

\* cited by examiner

PHOTOVOLTAIC CELL CONTAINING NOVEL PHOTOACTIVE POLYMER

CROSS REFERENCE TO RELATED APPLICATIONS

This application is a divisional patent application that claims benefit of co-pending U.S. Utility patent application Ser. No. 13/777,183 filed Feb. 26, 2013, which claims benefit under 35 U.S.C. §365(c) as a continuation of co-pending international application PCT/US2011/049942 having the international filing date of Aug. 31, 2011, which claims benefit under 35 U.S.C. §119 of U.S. Provisional Application Ser. No. 61/379,563, filed Sep. 2, 2010, the contents of all of which are hereby incorporated by reference.

TECHNICAL FIELD

This disclosure relates to novel photoactive polymers, as well as related photovoltaic cells, articles, systems, and methods.

BACKGROUND

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material, thereby generating charge carriers (i.e., electrons and holes). As a result, the ability of the photoactive material to absorb light and general charge carriers can limit the overall efficiency of a photovoltaic cell.

SUMMARY

This disclosure is based on the unexpected discovery that introducing a fluoro substituted phenyl moiety into a photoactive polymer (e.g., a conjugated polymer) could result in a novel polymer having a lowered highest occupied molecular orbital (HOMO) than a conventional photoactive polymer without significantly changing the bandgap of the photoactive polymer (e.g., by lowering the HOMO and the lowest unoccupied molecular orbital (LUMO) simultaneously). As a result, the novel polymer can be used to prepare a photovoltaic cell with an improved open circuit voltage ($V_{oc}$) and improved energy conversion efficiency.

In one aspect, this disclosure features a polymer that includes first and second comonomer repeat units. The first comonomer repeat unit includes a phenyl moiety substituted with 2-4 halo groups or 2-4 $C_1$-$C_4$ trihaloalkyl groups. The second comonomer repeat unit includes a benzodithiophene moiety, a cyclopentadithiazole moiety, a benzothiadiazole moiety, a thiadiazoloquinoxaline moiety, a benzoisothiazole moiety, a benzothiazole moiety, a dibenzosilole moiety, a thienothiophene moiety, a carbazole moiety, a dithienothiophene moiety, a tetrahydroisoindole moiety, a fluorene moiety, a silole moiety, a cyclopentadithiophene moiety, a thiazole moiety, a thiazolothiazole moiety, a naphthothiadiazole moiety, a thienopyrazine moiety, a silacyclopentadithiophene moiety, an oxazole moiety, an imidazole moiety, a pyrimidine moiety, a benzoxazole moiety, a benzimidazole moiety, a pyridopyrazine moiety, a pyrazinopyridazine moiety, a pyrazinoquinoxaline moiety, a thiadiazolopyridine moiety, a thiadiazolopyridazine moiety, a benzooxadiazole moiety, an oxadiazolopyridine moiety, an oxadiazolopyridazine moiety, a benzoselenadiazole moiety, a benzobisoxazole moiety, a thienothiadiazole moiety, a thienopyrroledione moiety, a tetrazine moiety, a pyrrolopyrroledione moiety, or a benzotriazole moiety.

In another aspect, this disclosure features a polymer of formula (I):

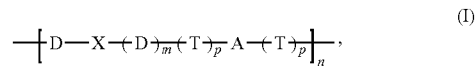

in which m is 0 or 1; each p, independently, is 0, 1, or 2; n is an integer greater than 1; X is a phenyl moiety substituted with 2-4 halo groups or 2-4 $C_1$-$C_4$ trihaloalkyl groups; each D, independently, is a benzodithiophene moiety, a carbazole moiety, a fluorene moiety, a cyclopentadithiophene moiety, or a silacyclopentadithiophene moiety; A is a cyclopentadithiazole moiety, a benzothiadiazole moiety, a thiadiazoloquinoxaline moiety, a benzoisothiazole moiety, a benzothiazole moiety, a thienothiophene moiety, a tetrahydroisoindole moiety, a thiazole moiety, a thiazolothiazole moiety, a naphthothiadiazole moiety, a thienopyrazine moiety, an oxazole moiety, an imidazole moiety, a pyrimidine moiety, a benzoxazole moiety, a benzimidazole moiety, a pyridopyrazine moiety, a pyrazinopyridazine moiety, a pyrazinoquinoxaline moiety, a thiadiazolopyridine moiety, a thiadiazolopyridazine moiety, a benzooxadiazole moiety, an oxadiazolopyridine moiety, an oxadiazolopyridazine moiety, a benzoselenadiazole moiety, a benzobisoxazole moiety, a thienothiadiazole moiety, a thienopyrroledione moiety, a tetrazine moiety, a pyrrolopyrroledione moiety, a thiophene moiety, a selenophene moiety, a thiadiazole moiety, a quinoxaline moiety, a benzotriazole moiety, or a furan moiety; and each T, independently, is a thienothiophene moiety, a thiazole moiety, a thiophene moiety, a selenophene moiety, a thiadiazole moiety, or a furan moiety.

In still another aspect, this disclosure features an article that includes a first electrode, a second electrode, and a photoactive material disposed between the first and second electrodes. The photoactive material includes one or more of the polymers described above. The article is configured as a photovoltaic cell.

Features and advantages of the polymers and photovoltaic cells described in this disclosure will be apparent from the description, drawings, and claims.

DESCRIPTION OF DRAWINGS

Like reference symbols in the various drawings indicate like elements.

DETAILED DESCRIPTION

Figure 1:
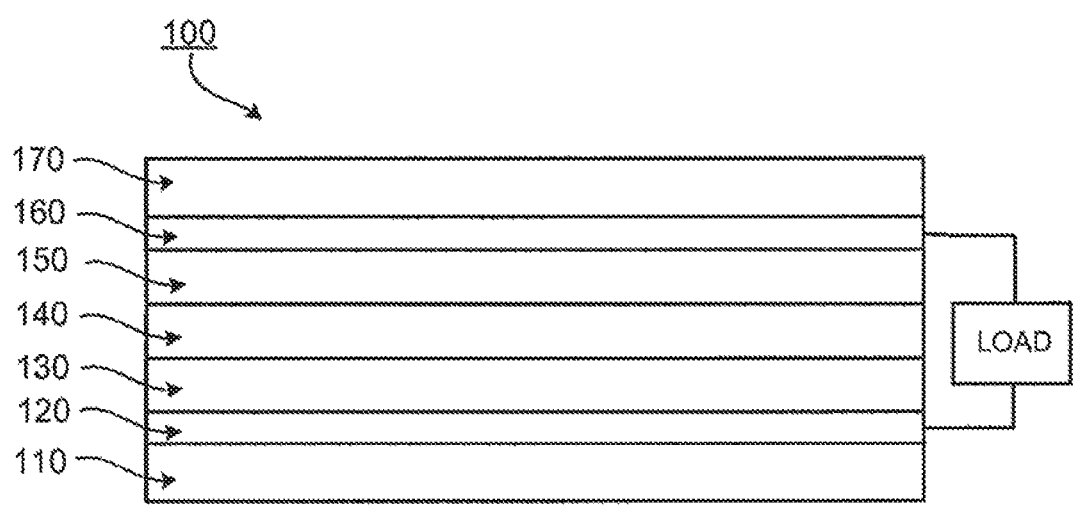
FIG. 1 is a cross-sectional view of an embodiment of a photovoltaic cell.

FIG. 1 shows a cross-sectional view of a photovoltaic cell 100 that includes a substrate 110, an electrode 120, an optional hole blocking layer 130, a photoactive layer 140 (e.g., containing an electron acceptor material and an electron donor material), a hole carrier layer 150, an electrode 160, and a substrate 170.

In general, during use, light can impinge on the surface of substrate 110, and passes through substrate 110, electrode 120, and optional hole blocking layer 130. The light then interacts with photoactive layer 140, causing electrons to be transferred from the electron donor material (e.g., a photoactive polymer described herein) to the electron acceptor material (e.g., a substituted fullerene). The electron acceptor material then transmits the electrons through optional hole blocking layer 130 to electrode 120, and the electron donor material transfers holes through hole carrier layer 150 to electrode 160. Electrodes 120 and 160 are in electrical connection via an external load so that electrons pass from electrode 120 through the load to electrode 160.

In some embodiments, the electron donor or acceptor material can include one or more polymers (e.g., homopolymers or copolymers). A polymer mentioned herein includes at least two identical or different monomer repeat units (e.g., at least 5 monomer repeat units, at least 10 monomer repeat units, at least 50 monomer repeat units, at least 100 monomer repeat units, or at least 500 monomer repeat units). A homopolymer mentioned herein refers to a polymer that includes monomer repeat units with the same chemical structure. A copolymer mentioned herein refers to a polymer that includes at least two (e.g., three or four) monomer repeat units with different chemical structures. In general, the polymers suitable for use as electron donor or acceptor materials are photoactive.

In general, the electron donor material suitable for photoactive layer 140 can be a photoactive copolymer that includes a first comonomer repeat unit and a second comonomer repeat unit different from the first monomer repeat unit. In such embodiments, the photoactive polymer optionally further includes a third comonomer repeat unit different from the first and second comonomer repeat units or a fourth comonomer repeat unit different from the first, second, and third comonomer repeat unit.

In some embodiments, the electron donor material can include a photoactive polymer (e.g., a conjugate polymer) that includes a first comonomer repeat unit containing a phenyl moiety substituted with two, three, or four halo (e.g., fluoro, chloro, or bromo) groups, or two, three, or four $C_1$-$C_4$ trihaloalkyl groups (e.g., trifluoromethyl). Without wishing to be bound by theory, it is believed that such a photoactive polymer can possess a HOMO (e.g., between about −6.3 eV and about −5.4 eV) lower than that of a conventional photoactive polymer while still maintaining a desirable bandgap (e.g., between about 1.4 eV and about 2.3 eV). As a result, such a photoactive polymer can be used to prepare a photovoltaic cell with an improved $V_{oc}$ and improved energy conversion efficiency. In addition, such a photoactive polymer can exhibit a lower LUMO, improved hole mobility, and improved fill factor compared to a conventional photoactive polymer. Without wishing to be bound by theory, it is believed that such a photoactive polymer can be used to prepare a photoactive layer with a sufficiently large thickness (e.g., at least about 150 nm, at least about 200 nm, at least about 250 nm, or at least about 300 nm) while still maintaining a sufficiently high fill factor. A photoactive layer with such a thickness can be readily prepared by using a continuous roll-to-roll process, thereby reducing the manufacturing costs of a photovoltaic cell.

In some embodiments, the first comonomer repeat unit in the photoactive polymer can include a phenyl moiety of formula (1):

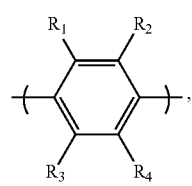

in which each of $R_1$, $R_2$, $R_3$, and $R_4$, independently, is H, halo (e.g., fluoro, chloro, or bromo), or $C_1$-$C_4$ trihaloalkyl (e.g., trifluoromethyl), provided that at least two of $R_1$, $R_2$, $R_3$, and $R_4$ is halo or $C_1$-$C_4$ trihaloalkyl.

In some embodiments, the photoactive polymer can include a second comonomer repeat unit different from the first comonomer repeat unit. For example, the second comonomer repeat unit can include a benzodithiophene moiety, a cyclopentadithiazole moiety, a benzothiadiazole moiety, a thiadiazoloquinoxaline moiety, a benzoisothiazole moiety, a benzothiazole moiety, a dibenzosilole moiety, a thienothiophene moiety, a carbazole moiety, a dithienothiophene moiety, a tetrahydroisoindole moiety, a fluorene moiety, a silole moiety, a cyclopentadithiophene moiety, a thiazole moiety, a thiazolothiazole moiety, a naphthothiadiazole moiety, a thienopyrazine moiety, a silacyclopentadithiophene moiety, an oxazole moiety, an imidazole moiety, a pyrimidine moiety, a benzoxazole moiety, a benzimidazole moiety, a pyridopyrazine moiety, a pyrazinopyridazine moiety, a pyrazinoquinoxaline moiety, a thiadiazolopyridine moiety, a thiadiazolopyridazine moiety, a benzooxadiazole moiety, an oxadiazolopyridine moiety, an oxadiazolopyridazine moiety, a benzoselenadiazole moiety, a benzobisoxazole moiety, a thienothiadiazole moiety, a thienopyrroledione moiety, a tetrazine moiety, a pyrrolopyrroledione moiety, or a benzotriazole moiety.

In some embodiments, the second comonomer repeat unit in the photoactive polymer can include a benzodithiophene moiety of formula (2), a benzodithiophene moiety of formula (3), a cyclopentadithiazole moiety of formula (4), a benzothiadiazole moiety of formula (5), a thiadiazoloquinoxaline moiety of formula (6), a benzoisothiazole moiety of formula (7), a benzothiazole moiety of formula (8), a dibenzosilole moiety of formula (9), a thienothiophene moiety of formula (10), a thienothiophene moiety of formula (11), a carbazole moiety of formula (12), a dithienothiophene moiety of formula (13), a tetrahydroisoindole moiety of formula (14), a fluorene moiety of formula (15), a silole moiety of formula (16), a cyclopentadithiophene moiety of formula (17), a thiazole moiety of formula (18), a thiazolothiazole moiety of formula (19), a naphthothiadiazole moiety of formula (20), a thienopyrazine moiety of formula (21), a silacyclopentadithiophene moiety of formula (22), an oxazole moiety of formula (23), an imidazole moiety of formula (24), a pyrimidine moiety of formula (25), a benzoxazole moiety of formula (26), a benzimidazole moiety of formula (27), a pyridopyrazine moiety of formula (28), a pyrazinopyridazine moiety of formula (29), a pyrazinoquinoxaline moiety of formula (30), a thiadiazolopyridine moiety of formula (31), a thiadiazolopyridazine moiety of formula (32), a benzooxadiazole moiety of formula (33), an oxadiazolopyridine moiety of formula (34), an oxadiazolopyridazine moiety of formula (35), a benzoselenadiazole moiety of formula (36), a benzobisoxazole moiety of formula (37), a benzobisoxazole moiety of formula (38), a thienothiadiazole moiety of formula (39), a thienopyrroledione moiety of formula (40), a tetrazine moiety of formula (41), a pyrrolopyrroledione moiety of formula (42), a benzotriazole moiety of formula (47), or a benzodithiophene moiety of formula (48):
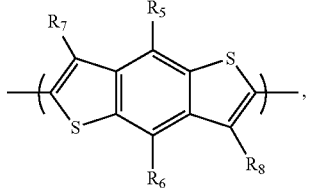 (2)
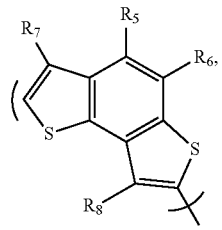 (3)
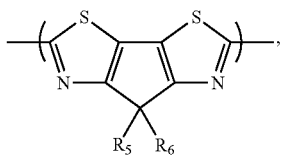 (4)
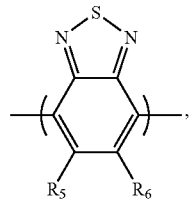 (5)
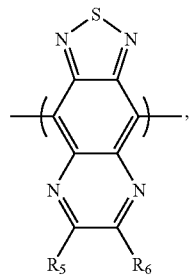 (6)
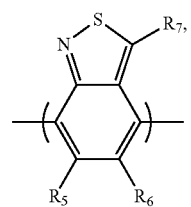 (7)
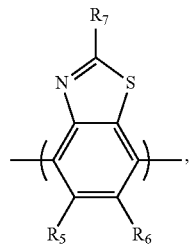 (8)
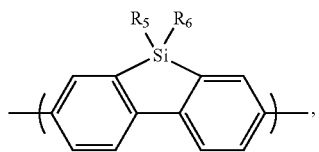 (9)
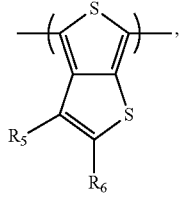 (10)
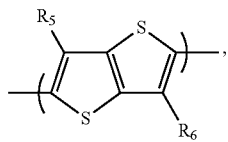 (11)
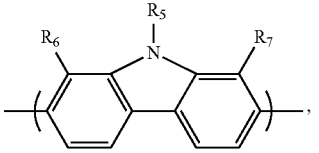 (12)
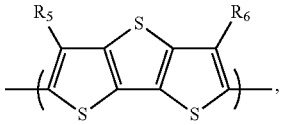 (13)
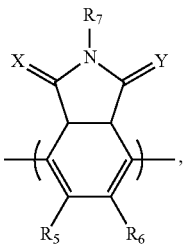 (14)
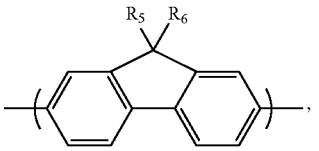 (15)
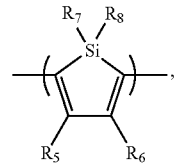 (16)
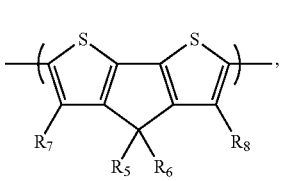 (17)

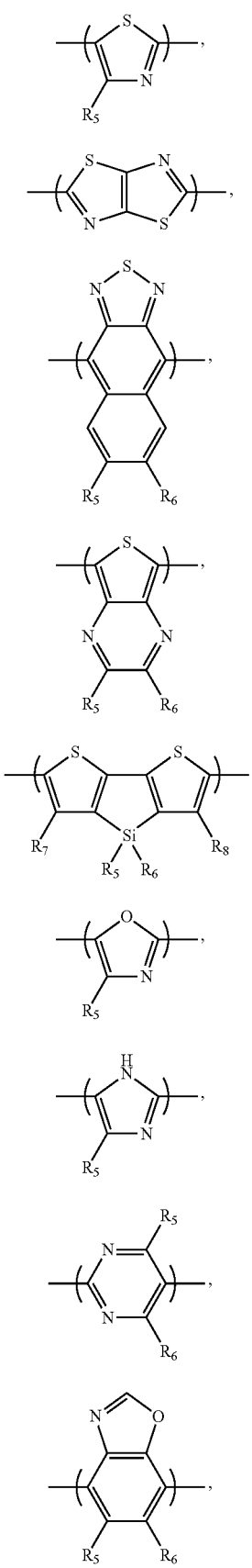
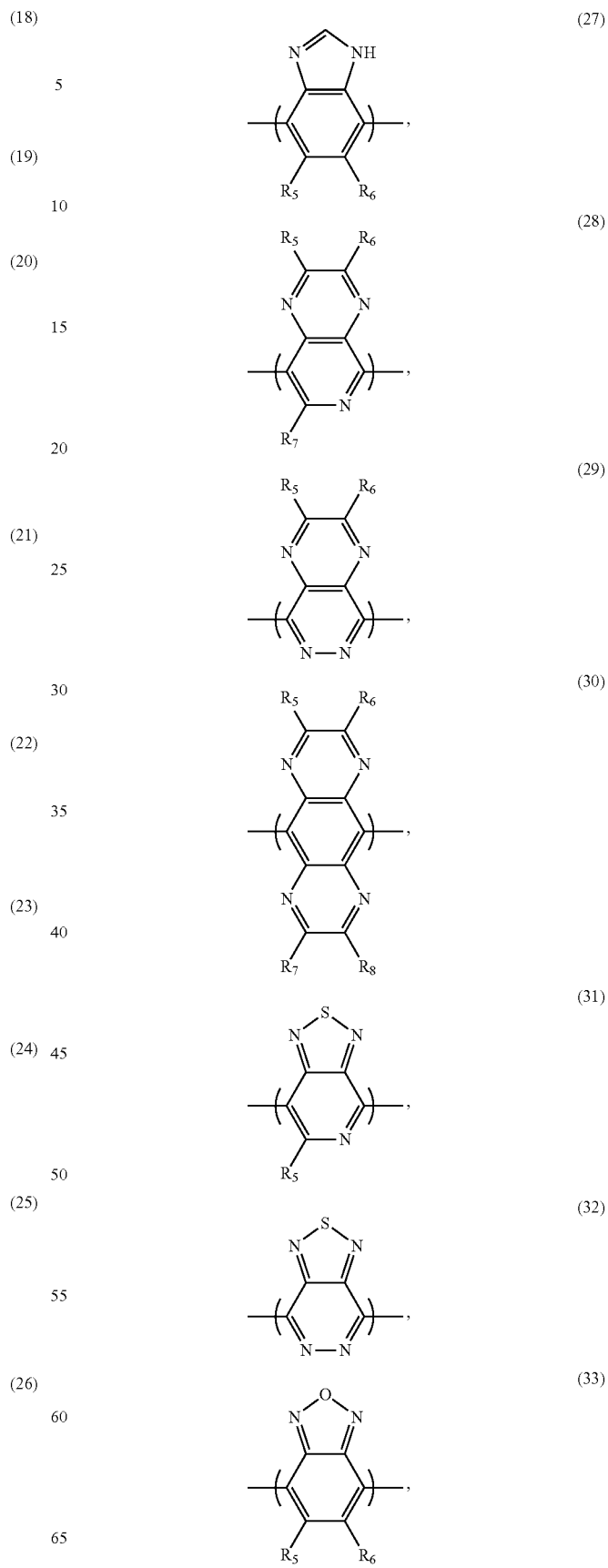

(34) 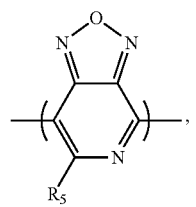

(35) 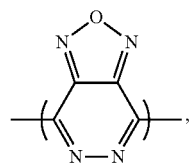

(36) 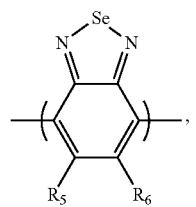

(37) 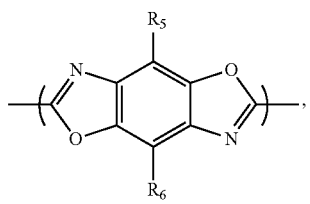

(38) 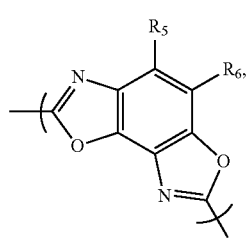

(39) 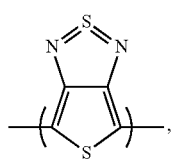

(40) 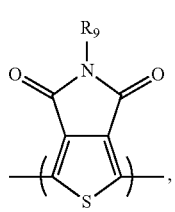

(41) 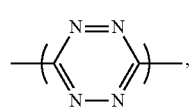

(42) 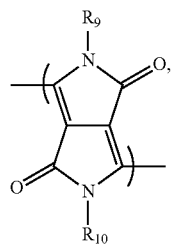

(47) 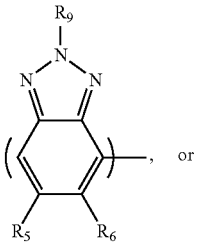, or

(48) 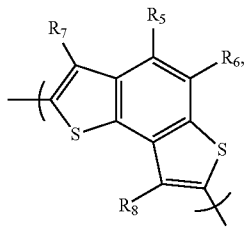

in each of X and Y, independently, is $CH_2$, O, or S; each of $R_5$, $R_6$, $R_7$, and $R_8$, independently, is H, halo, $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, CN, OR, COR, COOR, or CON(RR'), in which each of R and R', independently, is H, $C_1$-$C_{24}$ alkyl, aryl, heteroaryl, $C_3$-$C_{24}$ cycloalkyl, or $C_3$-$C_{24}$ heterocycloalkyl; and each of $R_9$ and $R_{10}$, independently, is H, $C_1$-$C_{24}$ alkyl, aryl, heteroaryl, $C_3$-$C_{24}$ cycloalkyl, or $C_3$-$C_{24}$ heterocycloalkyl. For example, the second comonomer repeat unit can include the benzodithiophene moiety of formula (2) or the silacyclopentadithiophene moiety of formula (22), in which each of $R_5$, $R_6$, $R_7$, and $R_8$, independently, is H, $C_1$-$C_{24}$ alkyl (e.g., $C_8H_{17}$ alkyl), or COOR (e.g., $COOC_{12}H_{25}$).

As used herein, an alkyl can be saturated or unsaturated and branched or straight chained. A $C_1$-$C_{24}$ alkyl contains any of 1 to 24 carbon atoms. Examples of alkyl moieties include —$CH_3$, —$CH_2$—, —$CH_2$=$CH_2$—, —$CH_2$—CH=$CH_2$, and branched —$C_3H_7$. An alkoxy can be branched or straight chained and saturated or unsaturated. A $C_1$-$C_{24}$ alkoxy contains an oxygen radical and any of 1 to 24 carbon atoms. Examples of alkoxy moieties include —$OCH_3$ and —OCH=CH—$CH_3$. A cycloalkyl can be either saturated or unsaturated and can contain one or more (e.g., two, three, four, or five) rings. A $C_3$-$C_{24}$ cycloalkyl contains any of 3 to 24 carbon atoms. Examples of cycloalkyl moieties include cyclohexyl and cyclohexen-3-yl. A heterocycloalkyl can also be either saturated or unsaturated and can contain one or more (e.g., two, three, four, or five) rings. A $C_3$-$C_{24}$ heterocycloalkyl contains at least one ring heteroatom (e.g., O, N, and S) and any of 3 to 24 carbon atoms. Examples of heterocycloalkyl moieties include 4-tetrahydropyranyl and 4-pyranyl. An aryl can contain one or more (e.g., two, three, four, or five) aromatic rings. Examples of aryl moieties include phenyl, phenylene, naphthyl, naphthylene, pyrenyl, anthryl, and phenanthryl. A heteroaryl can contain one or more (e.g., two, three, four, or five) aromatic rings, at least one of which contains at least one ring heteroatom (e.g., O, N, and S). Examples of heteroaryl moieties include furyl, furylene, fluorenyl, pyrrolyl, thienyl, oxazolyl, imidazolyl, thiazolyl, pyridyl, pyrimidinyl, quinazolinyl, quinolyl, isoquinolyl, and indolyl.

Alkyl, alkoxy, cycloalkyl, heterocycloalkyl, aryl, and heteroaryl mentioned herein include both substituted and unsubstituted moieties, unless specified otherwise. Examples of substituents on cycloalkyl, heterocycloalkyl, aryl, and heteroaryl include $C_{20}$ alkyl, $C_3$-$C_{20}$ cycloalkyl, $C_1$-$C_{20}$ alkoxy, aryl, aryloxy, heteroaryl, heteroaryloxy, amino, $C_1$-$C_{10}$ alkylamino, $C_1$-$C_{20}$ dialkylamino, arylamino, diarylamino, hydroxyl, halogen, thio, $C_1$-$C_{10}$ alkylthio, arylthio, $C_1$-$C_{10}$ alkylsulfonyl, arylsulfonyl, cyano, nitro, acyl, acyloxy, carboxyl, and carboxylic ester. Examples of substituents on alkyl include all of the above-recited substituents except $C_1$-$C_{20}$ alkyl. Cycloalkyl, heterocycloalkyl, aryl, and heteroaryl also include fused groups.

In some embodiments, the photoactive polymer can include an optional third comonomer repeat unit different from the first and second comonomer repeat units. For example, the optional third comonomer repeat unit can include a benzodithiophene moiety, a cyclopentadithiazole moiety, a benzothiadiazole moiety, a thiadiazoloquinoxaline moiety, a benzoisothiazole moiety, a benzothiazole moiety, a dibenzosilole moiety, a thienothiophene moiety, a carbazole moiety, a dithienothiophene moiety, a tetrahydroisoindole moiety, a fluorene moiety, a silole moiety, a cyclopentadithiophene moiety, a thiazole moiety, a thiazolothiazole moiety, a naphthothiadiazole moiety, a thienopyrazine moiety, a silacyclopentadithiophene moiety, an oxazole moiety, an imidazole moiety, a pyrimidine moiety, a benzoxazole moiety, a benzimidazole moiety, a pyridopyrazine moiety, a pyrazinopyridazine moiety, a pyrazinoquinoxaline moiety, a thiadiazolopyridine moiety, a thiadiazolopyridazine moiety, a benzooxadiazole moiety, an oxadiazolopyridine moiety, an oxadiazolopyridazine moiety, a benzoselenadiazole moiety, a benzobisoxazole moiety, a thienothiadiazole moiety, a thienopyrroledione moiety, a tetrazine moiety, a pyrrolopyrroledione moiety, a thiophene moiety, a selenophene moiety, a thiadiazole moiety, a quinoxaline moiety, or a benzotriazole moiety. For example, the optional third comonomer repeat unit can include any of the moieties of formulas (2)-(42), (47), and (48) described above. As another example, the optional third comonomer repeat unit can include a thiophene moiety of formula (43), a selenophene moiety of formula (44), a thiadiazole moiety of formula (45), a quinoxaline moiety of formula (46), or a furan moiety of formula (49):

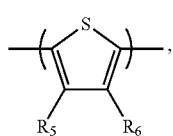
(43)

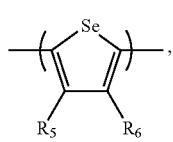
(44)

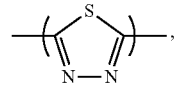
(45)

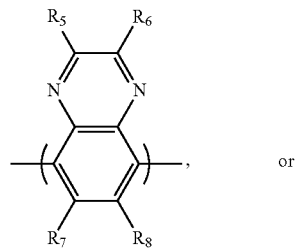
(46)

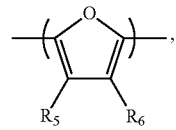
(49)

in which each of X and Y, independently, is $CH_2$, O, or S; and each of $R_5$, $R_6$, $R_7$, and $R_8$, independently, is H, halo, $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, CN, OR, COR, COOR, or CON (RR'), in which each of R and R', independently, is H, $C_1$-$C_{24}$ alkyl, aryl, heteroaryl, $C_3$-$C_{24}$ cycloalkyl, or $C_3$-$C_{24}$ heterocycloalkyl. In some embodiments, the optional third comonomer repeat unit in the electron donor material can include the benzothiadiazole moiety of formula (5) or the thiazolothiazole moiety of formula (19), in which each of $R_5$ and $R_6$ is H.

In some embodiments, the photoactive polymer can include an optional fourth comonomer repeat unit different from the first, second, and third comonomer repeat units. For example, the optional fourth comonomer repeat unit can include a thienothiophene moiety, a thiazole moiety, a thiazolothiazole moiety, a thiophene moiety, a selenophene moiety, a thiadiazole moiety, or a furan moiety.

In some embodiments, the optional fourth comonomer repeat unit can include a thienothiophene moiety of formula (10), a thienothiophene moiety of formula (11), a thiazole moiety of formula (18), a thiophene moiety of formula (43), a selenophene moiety of formula (44), a thiadiazole moiety of formula (45), or a furan moiety of formula (49):

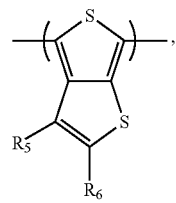
(10)

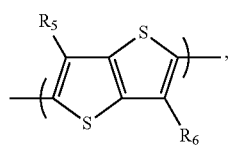
(11)

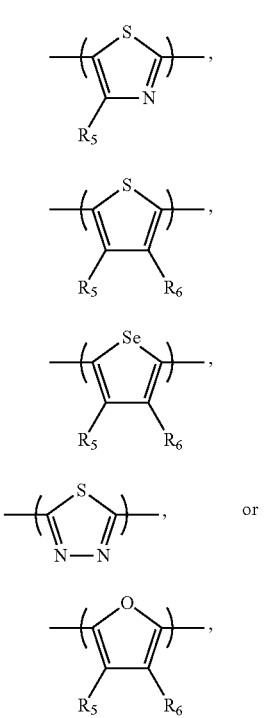

in which each of $R_5$ and $R_6$, independently, is H, halo, $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, CN, OR, COR, COOR, or CON (RR'), in which each of R and R', independently, is H, $C_1$-$C_{24}$ alkyl, aryl, heteroaryl, $C_3$-$C_{24}$ cycloalkyl, or $C_3$-$C_{24}$ heterocycloalkyl. For example, the optional fourth comonomer repeat unit can include the thiophene moiety of formula (43), in which each of $R_5$ and $R_6$, independently, is H, halo (e.g., Cl), or $C_1$-$C_{24}$ alkyl (e.g., $C_{14}H_{29}$).

In general, the molar ratio of the first, second, and optional third and fourth monomer repeat units in a photoactive polymer suitable for use as an electron donor material can vary as desired. In some embodiments, the molar ratio of the second monomer repeat unit to the first or third monomer repeat units is at least about 1:1 (e.g., at least about 2:1, at least about 3:1, or at least about 4:1) and/or at most about 10:1 (e.g., at most about 5:1, at most about 4:1, at most about 3:1, or at most about 2:1). In some embodiments, the molar ratio of the fourth monomer repeat unit to the third monomer repeat units is at least about 1:1 (e.g., at least about 2:1, at least about 3:1, or at least about 4:1) and/or at most about 10:1 (e.g., at most about 5:1, at most about 4:1, at most about 3:1, or at most about 2:1). For example, a copolymer containing three monomer repeat units can have the first, second, and third monomer repeat units in a molar ratio of about 1:2:1. As another example, a copolymer containing four monomer repeat units can have the first, second, third, and fourth monomer repeat units in a molar ratio of about 1:2:1:2.

Exemplary photoactive polymers that can be used as an electron donor material in photoactive layer 140 include polymers 1-4 listed below:

(polymer 1)

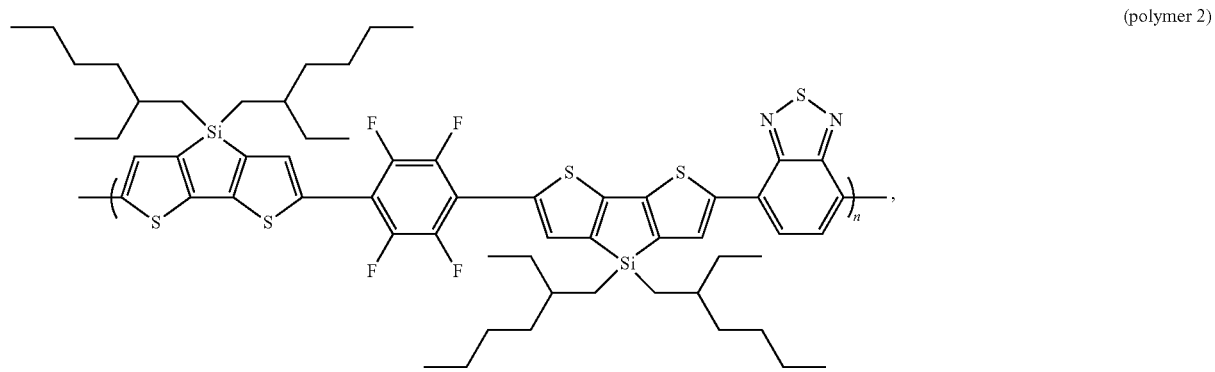

(polymer 2)

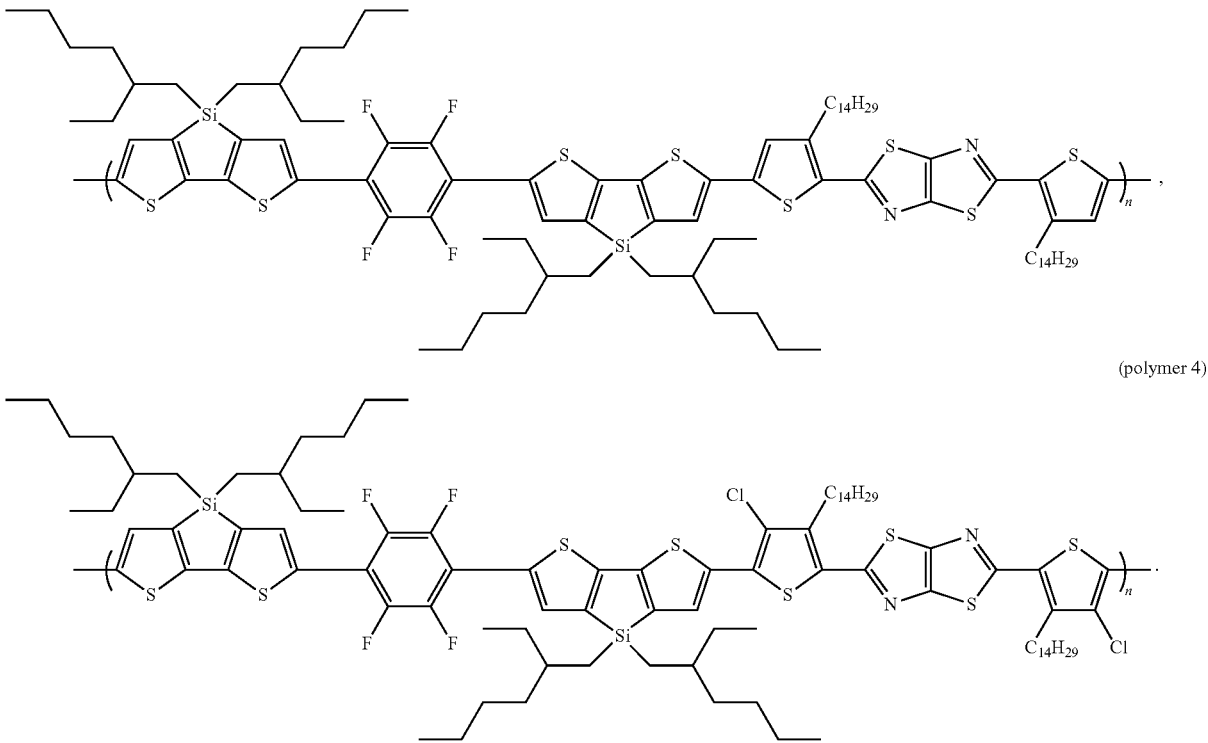

(polymer 3)

(polymer 4)

Polymer 1 is an exemplary photoactive polymer containing first and second comonomer repeat units. Polymer 2 is an exemplary photoactive polymer containing first, second, and third comonomer repeat units. Polymers 3 and 4 are exemplary photoactive polymers containing first, second, third, and fourth comonomer repeat units.

In some embodiments, the photoactive polymer can include a polymer of formula (I):

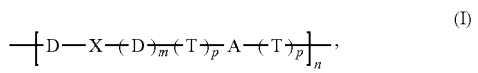

in which m is 0 or 1; each p, independently, is 0, 1, or 2; n is an integer greater than 1; X is a phenyl moiety substituted with 2-4 halo groups or 2-4 $C_1$-$C_4$ trihaloalkyl groups; each D, independently, is a benzodithiophene moiety, a carbazole moiety, a fluorene moiety, a cyclopentadithiophene moiety, or a silacyclopentadithiophene moiety; A is a cyclopentadithiazole moiety, a benzothiadiazole moiety, a thiadiazoloquinoxaline moiety, a benzoisothiazole moiety, a benzothiazole moiety, a thienothiophene moiety, a tetrahydroisoindole moiety, a thiazole moiety, a thiazolothiazole moiety, a naphthothiadiazole moiety, a thienopyrazine moiety, an oxazole moiety, an imidazole moiety, a pyrimidine moiety, a benzoxazole moiety, a benzimidazole moiety, a pyridopyrazine moiety, a pyrazinopyridazine moiety, a pyrazinoquinoxaline moiety, a thiadiazolopyridine moiety, a thiadiazolopyridazine moiety, a benzooxadiazole moiety, an oxadiazolopyridine moiety, an oxadiazolopyridazine moiety, a benzoselenadiazole moiety, a benzobisoxazole moiety, a thienothiadiazole moiety, a thienopyrroledione moiety, a tetrazine moiety, a pyrrolopyrroledione moiety, a thiophene moiety, a selenophene moiety, a thiadiazole moiety, a quinoxaline moiety, a benzotriazole moiety, or a furan moiety; and each T, independently, is a thienothiophene moiety, a thiazole moiety, a thiophene moiety, a selenophene moiety, a thiadiazole moiety, or a furan moiety. In some embodiments, n is an integer ranging from at least 2 (e.g., at least 5, at least 10, at least 50, or at least 100) to at most 1,000 (e.g., at most 750, at most 500, at most 250, at most 100, or at most 75). Examples of polymers of formula (I) include polymers 1-4 described above.

In some embodiments, X in formula (I) is the phenyl moiety of formula (1) described above. For example, each of $R_1$, $R_2$, $R_3$, and $R_4$ in formula (I), independently, can be halo (e.g., fluoro, chloro, or bromo).

In some embodiments, each D in formula (I), independently, is any one of the moieties of formulas (2), (3), (12), (15), (17), (22), and (48) described above. For example, each D, independently, can be the silacyclopentadithiophene moiety of formula (22), in which each of $R_5$, $R_6$, $R_7$, and $R_8$, independently, is H or $C_1$-$C_{24}$ alkyl. In some embodiments, each D is the silacyclopentadithiophene moiety of formula (22), in which each of $R_5$ and $R_6$ is $C_8H_{17}$ alkyl, and each of $R_7$ and $R_8$ is H.

In some embodiments, A in formula (I) is any one of the moieties of formulas (4)-(8), (10), (11), (14), (18)-(21), (23)-(47), and (49) described above. For example, A can be the benzothiadiazole moiety of formula (5) or the thiazolothiazole moiety of formula (19), in which each of $R_5$ and $R_6$ is H.

In some embodiments, each T in formula (I), independently, is any one of the moieties of formulas (10), (11), (18), (43)-(45), and (49) described above. For example, when each p is 1, each T, independently, can be the thiophene moiety of formula (43), in which each of $R_5$ and $R_6$, independently, is H, halo (e.g., Cl), or $C_1$-$C_{24}$ alkyl (e.g., $C_{14}H_{29}$ alkyl).

In some embodiments, the photoactive polymer described above can have a HOMO of at most about −5.4 eV (e.g., at most about −5.5 eV, at most about −5.6 eV, at most about −5.7 eV, or at most about −5.8 eV) and/or at least about −6.3 eV (e.g., at least about −6.2 eV, at least about −6.1 eV, at least about −6.0 eV, or at least about −5.9 eV).

In some embodiments, the photoactive polymer described above can have a LUMO of at most about −3.3 eV (e.g., at most about −3.4 eV, at most about −3.5 eV, at most about −3.6 eV, or at most about −3.7 eV) and/or at least about −4.2 eV (e.g., at least about −4.1 eV, at least about −4.0 eV, at least about −3.9 eV, or at least about −3.8 eV).

In some embodiments, the photoactive polymer described above can have a bandgap of at most about 2.3 eV (e.g., at most about 2.2 eV, at most about 2.1 eV, at most about 2.0 eV, or at most about 1.9 eV) and/or at least about 1.4 eV (e.g., at least about 1.5 eV, at least about 1.6 eV, at least about 1.7 eV, or at least about 1.8 eV).

Without wishing to be bound by theory, it is believed that a photovoltaic cell having one of the copolymers described above (e.g., a polymer containing the first, second, and optional third and fourth monomer repeat units described above) can have a high energy conversion efficiency. In some embodiments, such a photovoltaic cell can have an efficiency of at least about 4% (e.g., at least about 5%, at least about 6%, or at least about 7%) under AM 1.5 conditions. Further, without wishing to be bound by theory, it is believed that other advantages of the copolymers described above include suitable band gap (e.g., 1.6-2.0 eV) that can improve photocurrent and cell voltage, high positive charge mobility (e.g., $10^{-4}$ to $10^{-1}$ cm$^2$/Vs) that can facilitate charge separation in photoactive layer 140, and high solubility in an organic solvent that can improve film forming ability and processability.

The photoactive polymers described above can be prepared by methods known in the art. For example, a copolymer can be prepared by a cross-coupling reaction between one or more monomers containing two organometallic groups (e.g., alkylstannyl groups, Grignard groups, or alkylzinc groups) and one or more monomers containing two halo groups (e.g., Cl, Br, or I) in the presence of a transition metal catalyst. As another example, a copolymer can be prepared by a cross-coupling reaction between one or more monomers containing two borate groups and one or more monomers containing two halo groups (e.g., Cl, Br, or I) in the presence of a transition metal catalyst. Other methods that can be used to prepare the copolymers described above including Suzuki coupling reactions, Negishi coupling reactions, Kumada coupling reactions, and Stille coupling reactions, all of which are well known in the art. Examples 1-4 below provide descriptions of how polymers 1-4 listed above were actually prepared.

The monomers suitable for preparing the photoactive polymers described above can be prepared by the methods described herein or by the methods know in the art, such as those described in U.S. patent application Ser. No. 11/486, 536, Coppo et al., *Macromolecules* 2003, 36, 2705-2711, Kurt et al., *J. Heterocycl. Chem.* 1970, 6, 629, Chen et al., *J. Am. Chem. Soc.*, (2006) 128(34), 10992-10993, Hou et al., *Macromolecules* (2004), 37, 6299-6305, and Bijleveld et al., *Adv. Funct. Mater.*, (2009), 19, 3262-3270. The monomers can contain a non-aromatic double bond and one or more asymmetric centers. Thus, they can occur as racemates and racemic mixtures, single enantiomers, individual diastereomers, diastereomeric mixtures, and cis- or trans-isomeric forms. All such isomeric forms are contemplated.

In some embodiments, electron acceptor materials of photoactive layer 140 can include fullerenes. In some embodiments, photoactive layer 140 can include one or more unsubstituted fullerenes and/or one or more substituted fullerenes. Examples of unsubstituted fullerenes include $C_{60}$, $C_{70}$, $C_{76}$, $C_{78}$, $C_{82}$, $C_{84}$, and $C_{92}$. Examples of substituted fullerenes include fullerene substituted with phenyl-butyric acid methyl esters (PCBMs, such as C61-phenyl-butyric acid methyl ester (C61-PCBM) and C71-phenyl-butyric acid methyl ester (C71-PCBM)) or fullerenes substituted with $C_1$-$C_{20}$ alkoxy optionally further substituted with $C_1$-$C_{20}$ alkoxy and/or halo (e.g., $(OCH_2CH_2)_2OCH_3$ or $OCH_2CF_2OCF_2CF_2OCF_3$). Without wishing to be bound by theory, it is believed that fullerenes substituted with long-chain alkoxy groups (e.g., oligomeric ethylene oxides) or fluorinated alkoxy groups have improved solubility in organic solvents and can form a photoactive layer with improved morphology. Other examples of fullerenes have been described in, e.g., commonly-owned co-pending U.S. Application Publication No. 2005-0279399.

Turning to other components of photovoltaic cell 100, substrate 110 is generally formed of a transparent material. As referred to herein, a transparent material is a material which, at the thickness used in a photovoltaic cell 100, transmits at least about 60% (e.g., at least about 70%, at least about 75%, at least about 80%, at least about 85%) of incident light at a wavelength or a range of wavelengths used during operation of the photovoltaic cell. Exemplary materials from which substrate 110 can be formed include polyethylene terephthalates, polyimides, polyethylene naphthalates, polymeric hydrocarbons, cellulosic polymers, polycarbonates, polyamides, polyethers, and polyether ketones. In certain embodiments, the polymer can be a fluorinated polymer. In some embodiments, combinations of polymeric materials are used. In certain embodiments, different regions of substrate 110 can be formed of different materials.

In general, substrate 110 can be flexible, semi-rigid or rigid (e.g., glass). In some embodiments, substrate 110 has a flexural modulus of less than about 5,000 megaPascals (e.g., less than about 1,000 megaPascals or less than about 500 megaPascals). In certain embodiments, different regions of substrate 110 can be flexible, semi-rigid, or inflexible (e.g., one or more regions flexible and one or more different regions semi-rigid, one or more regions flexible and one or more different regions inflexible).

Typically, substrate 110 is at least about one micron (e.g., at least about five microns or at least about 10 microns) thick and/or at most about 1,000 microns (e.g., at most about 500 microns, at most about 300 microns, at most about 200 microns, at most about 100 microns, or at most about 50 microns) thick.

Generally, substrate 110 can be colored or non-colored. In some embodiments, one or more portions of substrate 110 is/are colored while one or more different portions of substrate 110 is/are non-colored.

Substrate 110 can have one planar surface (e.g., the surface on which light impinges), two planar surfaces (e.g., the surface on which light impinges and the opposite surface), or no planar surfaces. A non-planar surface of substrate 110 can, for example, be curved or stepped. In some embodiments, a non-planar surface of substrate 110 is patterned (e.g., having patterned steps to form a Fresnel lens, a lenticular lens or a lenticular prism).

Electrode 120 is generally formed of an electrically conductive material. Exemplary electrically conductive materials include electrically conductive metals, electrically conductive alloys, electrically conductive polymers, and electrically conductive metal oxides. Exemplary electrically conductive metals include gold, silver, copper, aluminum, nickel, palladium, platinum, and titanium. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum, and alloys of titanium. Exemplary electrically conducting polymers include polythiophenes (e.g., doped poly(3,4-ethylenedioxythiophene) (doped PEDOT)), polyanilines (e.g., doped polyanilines), polypyrroles (e.g., doped polypyrroles). Exemplary electrically conducting metal oxides include indium tin oxide, fluorinated tin oxide, tin oxide and zinc oxide. In some embodiments, combinations of electrically conductive materials are used.

In some embodiments, electrode 120 can include a mesh electrode. Examples of mesh electrodes are described in co-pending U.S. Patent Application Publication Nos. 20040187911 and 20060090791.

In some embodiments, a combination of the materials described above can be used to form electrode 120.

Optionally, photovoltaic cell 100 can include a hole blocking layer 130. The hole blocking layer is generally formed of a material that, at the thickness used in photovoltaic cell 100, transports electrons to electrode 120 and substantially blocks the transport of holes to electrode 120. Examples of materials from which the hole blocking layer can be formed include LiF, metal oxides (e.g., zinc oxide, titanium oxide), and amines (e.g., primary, secondary, or tertiary amines). Examples of amines suitable for use in a hole blocking layer have been described, for example, in co-pending U.S. Application Publication No. 2008-0264488.

Without wishing to be bound by theory, it is believed that when photovoltaic cell 100 includes a hole blocking layer made of amines, the hole blocking layer can facilitate the formation of ohmic contact between photoactive layer 140 and electrode 120 without being exposed to UV light, thereby reducing damage to photovoltaic cell 100 resulted from UV exposure.

Typically, hole blocking layer 130 is at least about 0.02 micron (e.g., at least about 0.03 micron, at least about 0.04 micron, or at least about 0.05 micron) thick and/or at most about 0.5 micron (e.g., at most about 0.4 micron, at most about 0.3 micron, at most about 0.2 micron, or at most about 0.1 micron) thick.

Hole carrier layer 150 is generally formed of a material that, at the thickness used in photovoltaic cell 100, transports holes to electrode 160 and substantially blocks the transport of electrons to electrode 160. Examples of materials from which layer 150 can be formed include polythiophenes (e.g., PEDOT), polyanilines, polycarbazoles, polyvinylcarbazoles, polyphenylenes, polyphenylvinylenes, polysilanes, polythienylenevinylenes, polyisothianaphthanenes, and copolymers thereof. In some embodiments, hole carrier layer 150 can include a dopant used in combination with one of the just-mentioned material. Examples of dopants include poly(styrene-sulfonate)s, polymeric sulfonic acids, or fluorinated polymers (e.g., fluorinated ion exchange polymers).

In some embodiments, the materials that can be used to form hole carrier layer 150 include metal oxides, such as titanium oxides, zinc oxides, tungsten oxides, molybdenum oxides, copper oxides, strontium copper oxides, or strontium titanium oxides. The metal oxides can be either undoped or doped with a dopant. Examples of dopants for metal oxides include salts or acids of fluoride, chloride, bromide, and iodide.

In some embodiments, the materials that can be used to form hole carrier layer 150 include carbon allotropes (e.g., carbon nanotubes). The carbon allotropes can be embedded in a polymer binder.

In some embodiments, the hole carrier materials can be in the form of nanoparticles. The nanoparticles can have any suitable shape, such as a spherical, cylindrical, or rod-like shape.

In some embodiments, hole carrier layer 150 can include combinations of hole carrier materials described above.

In general, the thickness of hole carrier layer 150 (i.e., the distance between the surface of hole carrier layer 150 in contact with photoactive layer 140 and the surface of electrode 160 in contact with hole carrier layer 150) can be varied as desired. Typically, the thickness of hole carrier layer 150 is at least about 0.01 micron (e.g., at least about 0.05 micron, at least about 0.1 micron, at least about 0.2 micron, at least about 0.3 micron, or at least about 0.5 micron) and/or at most about five microns (e.g., at most about three microns, at most about two microns, or at most about one micron). In some embodiments, the thickness of hole carrier layer 150 is from about 0.01 micron to about 0.5 micron.

Electrode 160 is generally formed of an electrically conductive material, such as one or more of the electrically conductive materials described above with respect to electrode 120. In some embodiments, electrode 160 is formed of a combination of electrically conductive materials. In certain embodiments, electrode 160 can be formed of a mesh electrode.

Substrate 170 can be identical to or different from substrate 110. In some embodiments, substrate 170 can be formed of one or more suitable polymers, such as the polymers used in substrate 110 described above.

Figure 2:
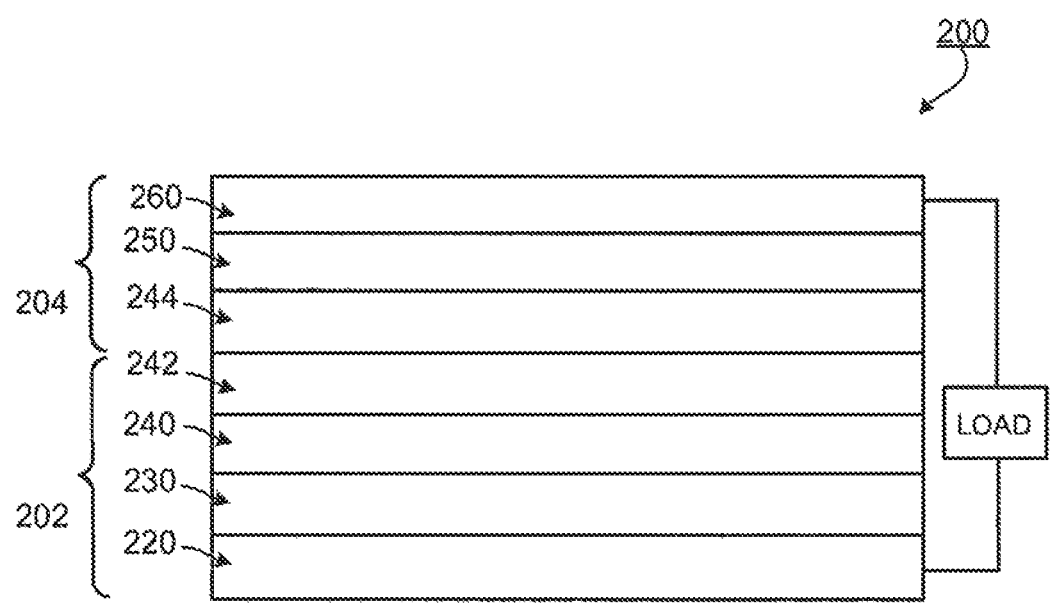
FIG. 2 is a cross-sectional view of an embodiment of a tandem photovoltaic cell.

In some embodiments, the photoactive polymers described above can be used as an electron donor material in a system in which two photovoltaic cells share a common electrode. Such a system is also known as tandem photovoltaic cell. FIG. 2 shows a tandem photovoltaic cell 200 having two semi-cells 202 and 204. Semi-cell 202 includes an electrode 220, an optional hole blocking layer 230, a first photoactive layer 240, and a recombination layer 242. Semi-cell 204 includes recombination layer 242, a second photoactive layer 244, a hole carrier layer 250, and an electrode 260. An external load is connected to photovoltaic cell 200 via electrodes 220 and 260.

Depending on the production process and the desired device architecture, the current flow in a semi-cell can be reversed by changing the electron/hole conductivity of a certain layer (e.g., changing hole blocking layer 230 to a hole carrier layer). By doing so, the semi-cells in a tandem cell can be electrically interconnected either in series or in parallel.

A recombination layer refers to a layer in a tandem cell where the electrons generated from a first semi-cell recombine with the holes generated from a second semi-cell. Recombination layer 242 typically includes a p-type semiconductor material and an n-type semiconductor material. In general, n-type semiconductor materials selectively transport electrons and p-type semiconductor materials selectively transport holes. As a result, electrons generated from the first semi-cell recombine with holes generated from the second semi-cell at the interface of the n-type and p-type semiconductor materials.

In some embodiments, the p-type semiconductor material includes a polymer and/or a metal oxide. Examples of p-type semiconductor polymers include the benzodithiophene-containing polymers described above, polythiophenes (e.g., poly (3,4-ethylene dioxythiophene) (PEDOT)), polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof. The metal oxide can be an intrinsic p-type semiconductor (e.g., copper oxides, strontium copper oxides, or strontium titanium oxides) or a metal oxide that forms a p-type semiconductor after doping with a dopant (e.g., p-doped zinc oxides or p-doped titanium oxides). Examples of dopants include salts or acids of fluoride, chloride, bromide, and iodide. In some embodiments, the metal oxide can be used in the form of nanoparticles.

In some embodiments, the n-type semiconductor material (either an intrinsic or doped n-type semiconductor material) includes a metal oxide, such as titanium oxides, zinc oxides, tungsten oxides, molybdenum oxides, and combinations thereof. The metal oxide can be used in the form of nanoparticles. In other embodiments, the n-type semiconductor material includes a material selected from the group consisting of fullerenes (such as those described above), inorganic nanoparticles, oxadiazoles, discotic liquid crystals, carbon nanorods, inorganic nanorods, polymers containing CN groups, polymers containing $CF_3$ groups, and combinations thereof.

In some embodiments, the p-type and n-type semiconductor materials are blended into one layer. In certain embodiments, recombination layer 242 includes two layers, one layer including the p-type semiconductor material and the other layer including the n-type semiconductor material. In such embodiments, recombination layer 242 can further include an electrically conductive layer (e.g., a metal layer or mixed n-type and p-type semiconductor materials) at the interface of the two layers.

In some embodiments, recombination layer 242 includes at least about 30 wt % (e.g., at least about 40 wt % or at least about 50 wt %) and/or at most about 70 wt % (e.g., at most about 60 wt % or at most about 50 wt %) of the p-type semiconductor material. In some embodiments, recombination layer 242 includes at least about 30 wt % (e.g., at least about 40 wt % or at least about 50 wt %) and/or at most about 70 wt % (e.g., at most about 60 wt % or at most about 50 wt %) of the n-type semiconductor material.

Recombination layer 242 generally has a sufficient thickness so that the layers underneath are protected from any solvent applied onto recombination layer 242. In some embodiments, recombination layer 242 can have a thickness of at least about 10 nm (e.g., at least about 20 nm, at least about 50 nm, or at least about 100 nm) and/or at most about 500 nm (e.g., at most about 200 nm, at most about 150 nm, or at most about 100 nm).

In general, recombination layer 242 is substantially transparent. For example, at the thickness used in a tandem photovoltaic cell 200, recombination layer 242 can transmit at least about 70% (e.g., at least about 75%, at least about 80%, at least about 85%, or at least about 90%) of incident light at a wavelength or a range of wavelengths (e.g., from about 350 nm to about 1,000 nm) used during operation of the photovoltaic cell.

Recombination layer 242 generally has a sufficiently low surface resistance. In some embodiments, recombination layer 242 has a surface resistance of at most about $1\times10^6$ ohm/square (e.g., at most about $5\times10^5$ ohm/square, at most about $2\times10^5$ ohm/square, or at most about $1\times10^5$ ohm/square).

Without wishing to be bound by theory, it is believed that recombination layer 242 can be considered as a common electrode between two semi-cells (e.g., one including electrode 220, hole blocking layer 230, photoactive layer 240, and recombination layer 242, and the other include recombination layer 242, photoactive layer 244, hole carrier layer 250, and electrode 260) in photovoltaic cells 200. In some embodiments, recombination layer 242 can include an electrically conductive grid (e.g., mesh) material, such as those described above. An electrically conductive grid material can provide a selective contact of the same polarity (either p-type or n-type) to the semi-cells and provide a highly conductive but transparent layer to transport electrons to a load.

In some embodiments, a one-layer recombination layer 242 can be prepared by applying a blend of an n-type semiconductor material and a p-type semiconductor material on a photoactive layer. For example, an n-type semiconductor and a p-type semiconductor can be first dispersed and/or dissolved in a solvent together to form a dispersion or solution, which can then be coated on a photoactive layer to form a recombination layer.

In some embodiments, a two-layer recombination layer can be prepared by applying a layer of an n-type semiconductor material and a layer of a p-type semiconductor material separately. For example, when titanium oxide nanoparticles are used as an n-type semiconductor material, a layer of titanium oxide nanoparticles can be formed by (1) dispersing a precursor (e.g., a titanium salt) in a solvent (e.g., an anhydrous alcohol) to form a dispersion, (2) coating the dispersion on a photoactive layer, (3) hydrolyzing the dispersion to form a titanium oxide layer, and (4) drying the titanium oxide layer. As another example, when a polymer (e.g., PEDOT) is used as a p-type semiconductor, a polymer layer can be formed by first dissolving the polymer in a solvent (e.g., an anhydrous alcohol) to form a solution and then coating the solution on a photoactive layer.

Other components in tandem cell 200 can be formed of the same materials, or have the same characteristics, as those in photovoltaic cell 100 described above.

Other examples of tandem photovoltaic cells have been described in, e.g., commonly-owned co-pending U.S. Application Publication Nos. 2007-0181179 and 2007-0246094.

In some embodiments, the semi-cells in a tandem cell are electrically interconnected in series. When connected in series, in general, the layers can be in the order shown in FIG. 2. In certain embodiments, the semi-cells in a tandem cell are electrically interconnected in parallel. When interconnected in parallel, a tandem cell having two semi-cells can include the following layers: a first electrode, a first hole blocking layer, a first photoactive layer, a first hole carrier layer (which can serve as an electrode), a second hole carrier layer (which can serve as an electrode), a second photoactive layer, a second hole blocking layer, and a second electrode. In such embodiments, the first and second hole carrier layers can be either two separate layers or can be one single layer. In case the conductivity of the first and second hole carrier layers is not sufficient, an additional layer (e.g., an electrically conductive mesh layer such as a metal mesh layer) providing the required conductivity may be inserted between the first and second hole carrier layers.

In some embodiments, a tandem cell can include more than two semi-cells (e.g., three, four, five, six, seven, eight, nine, ten, or more semi-cells). In certain embodiments, some semi-cells can be electrically interconnected in series and some semi-cells can be electrically interconnected in parallel.

In general, the methods of preparing each layer in photovoltaic cells described in FIGS. 1 and 2 can vary as desired. In some embodiments, a layer can be prepared by a liquid-based coating process. In certain embodiments, a layer can be prepared via a gas phase-based coating process, such as chemical or physical vapor deposition processes.

The term "liquid-based coating process" mentioned herein refers to a process that uses a liquid-based coating composition. Examples of the liquid-based coating composition include solutions, dispersions, or suspensions. The liquid-based coating process can be carried out by using at least one of the following processes: solution coating, ink jet printing, spin coating, dip coating, knife coating, bar coating, spray coating, roller coating, slot coating, gravure coating, flexographic printing, or screen printing. Examples of liquid-based coating processes have been described in, for example, commonly-owned co-pending U.S. Application Publication No. 2008-0006324.

In some embodiments, when a layer includes inorganic semiconductor nanoparticles, the liquid-based coating process can be carried out by (1) mixing the nanoparticles with a solvent (e.g., an aqueous solvent or an anhydrous alcohol) to form a dispersion, (2) coating the dispersion onto a substrate, and (3) drying the coated dispersion. In certain embodiments, a liquid-based coating process for preparing a layer containing inorganic metal oxide nanoparticles can be carried out by (1) dispersing a precursor (e.g., a titanium salt) in a suitable solvent (e.g., an anhydrous alcohol) to form a dispersion, (2) coating the dispersion on a substrate, (3) hydrolyzing the dispersion to form an inorganic semiconductor nanoparticles layer (e.g., a titanium oxide nanoparticles layer), and (4) drying the inorganic semiconductor material layer. In certain embodiments, the liquid-based coating process can be carried out by a sol-gel process (e.g., by forming metal oxide nanoparticles as a sol-gel in a dispersion before coating the dispersion on a substrate).

In general, the liquid-based coating process used to prepare a layer containing an organic semiconductor material can be the same as or different from that used to prepare a layer containing an inorganic semiconductor material. In some embodiments, to prepare a layer including an organic semiconductor material, the liquid-based coating process can be carried out by mixing the organic semiconductor material with a solvent (e.g., an organic solvent) to form a solution or a dispersion, coating the solution or dispersion on a substrate, and drying the coated solution or dispersion.

In some embodiments, the photovoltaic cells described in FIGS. 1 and 2 can be prepared in a continuous manufacturing process, such as a roll-to-roll process, thereby significantly reducing the manufacturing cost. Examples of roll-to-roll processes have been described in, for example, commonly-owned co-pending U.S. Application Publication No. 2005-0263179.

While certain embodiments have been disclosed, other embodiments are also possible.

In some embodiments, photovoltaic cell 100 includes a cathode as a bottom electrode and an anode as a top electrode. In some embodiments, photovoltaic cell 100 can include an anode as a bottom electrode and a cathode as a top electrode.

In some embodiments, photovoltaic cell 100 can include the layers shown in FIG. 1 in a reverse order. In other words, photovoltaic cell 100 can include these layers from the bottom to the top in the following sequence: a substrate 170, an electrode 160, a hole carrier layer 150, a photoactive layer 140, an optional hole blocking layer 130, an electrode 120, and a substrate 110.

In some embodiments, one of substrates 110 and 170 can be transparent. In other embodiments, both of substrates 110 and 170 can be transparent.

Figure 3:
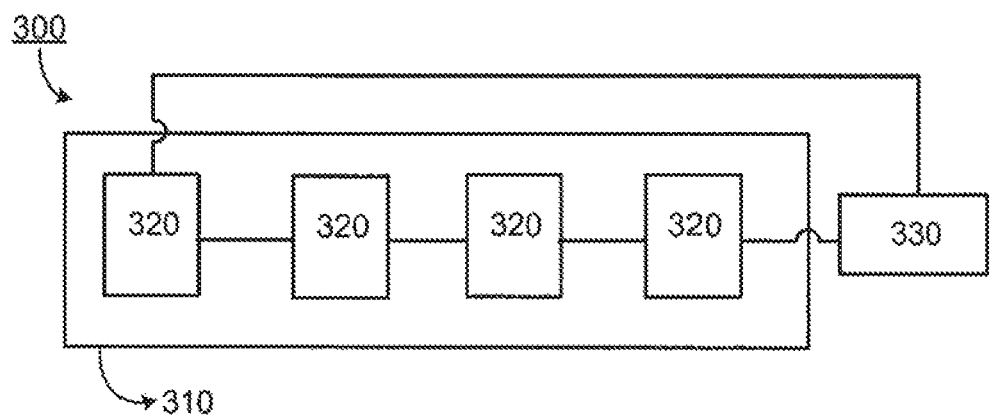
FIG. 3 is a schematic of a system containing multiple photovoltaic cells electrically connected in series.
Figure 4:
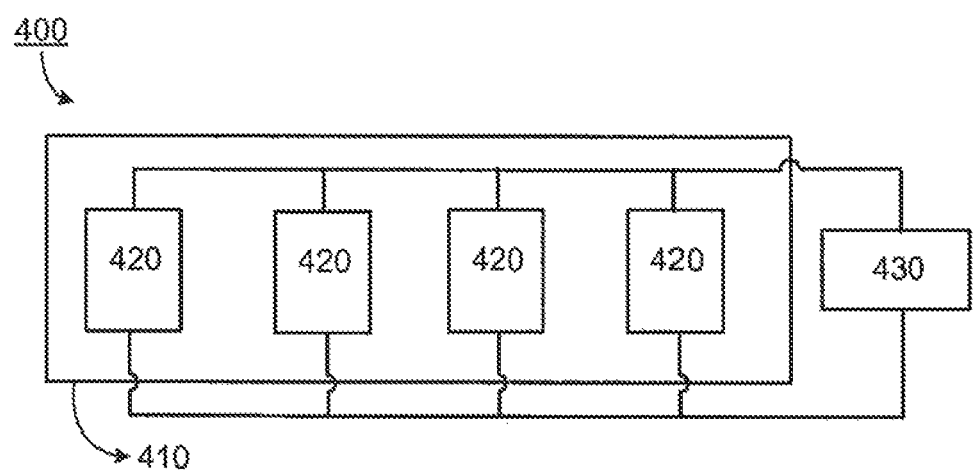
FIG. 4 is a schematic of a system containing multiple photovoltaic cells electrically connected in parallel.

In some embodiments, multiple photovoltaic cells can be electrically connected to form a photovoltaic system. As an example, FIG. 3 is a schematic of a photovoltaic system 300 having a module 310 containing a plurality of photovoltaic cells 320. Cells 320 are electrically connected in series, and system 300 is electrically connected to a load 330. As another example, FIG. 4 is a schematic of a photovoltaic system 400 having a module 410 that contains a plurality of photovoltaic cells 420. Cells 420 are electrically connected in parallel, and system 400 is electrically connected to a load 430. In some embodiments, some (e.g., all) of the photovoltaic cells in a photovoltaic system can be disposed on one or more common substrates. In certain embodiments, some photovoltaic cells in a photovoltaic system are electrically connected in series, and some of the photovoltaic cells in the photovoltaic system are electrically connected in parallel.

While organic photovoltaic cells have been described, other photovoltaic cells can also be integrated with one of the polymers described herein. Examples of such photovoltaic cells include dye sensitized photovoltaic cells and inorganic photoactive cells with a photoactive material formed of amorphous silicon, cadmium selenide, cadmium telluride, copper indium selenide, and copper indium gallium selenide. In some embodiments, a hybrid photovoltaic cell can be integrated with one of the polymers described herein.

While photovoltaic cells have been described above, in some embodiments, the polymers described herein can be used in other devices and systems. For example, the polymers can be used in suitable organic semiconductive devices, such as field effect transistors, photodetectors (e.g., IR detectors), photovoltaic detectors, imaging devices (e.g., RGB imaging devices for cameras or medical imaging systems), light emitting diodes (LEDs) (e.g., organic LEDs (OLEDs) or IR or near IR LEDs), lasing devices, conversion layers (e.g., layers that convert visible emission into IR emission), amplifiers and emitters for telecommunication (e.g., dopants for fibers), storage elements (e.g., holographic storage elements), and electrochromic devices (e.g., electrochromic displays).

The contents of all publications cited herein (e.g., patents, patent application publications, and articles) are hereby incorporated by reference in their entirety.

The following examples are illustrative and not intended to be limiting.

Example 1

Synthesis of 2,6-dibromo-didodecyl-4,8-benzodithiophenedicarboxylate 2,6-Dibromo-didodecyl-4,8-benzodithiophenedicarboxylate was synthesized based on the Scheme below.

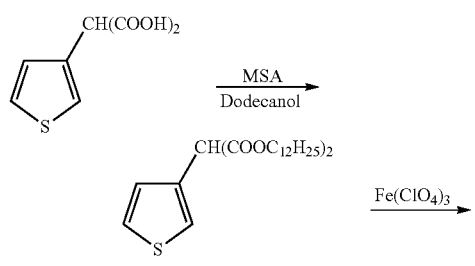

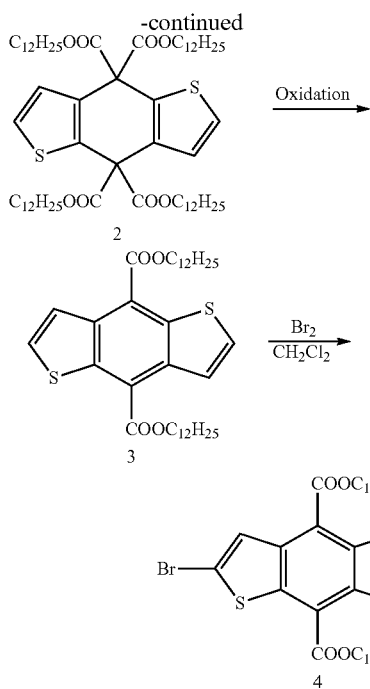

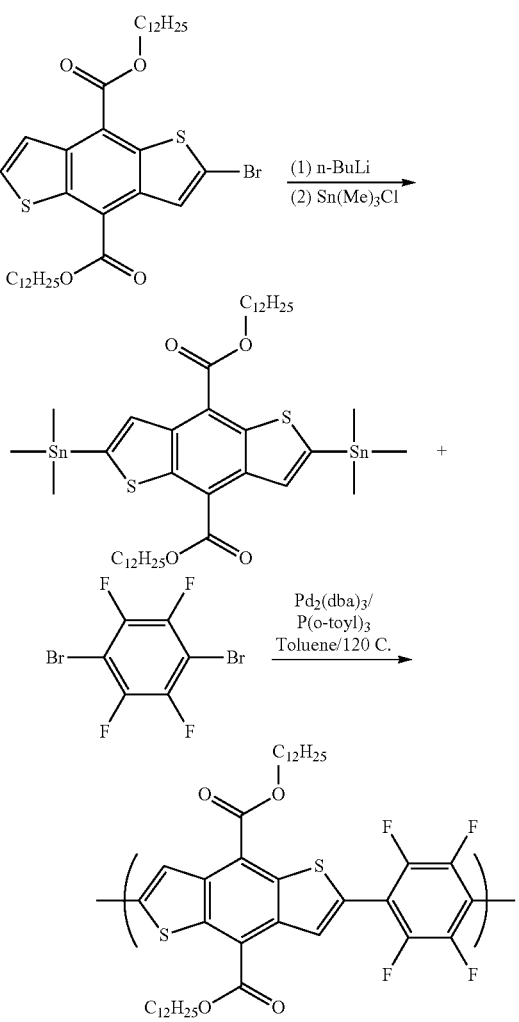

In a one-necked flask, 3-thienylmalonic acid (10.0 g, 53.7 mmol) and 1-dodecanol (4 eq., 40.0 g, 215 mmol) were dissolved in THF (80 mL) at room temperature. To this solution was added methanesulphonic acid (1.99 g, 20.7 mmol). The reaction mixture was stirred at room temperature for 3 days. The solvent was then evaporated at 40° C. The residue was purified by column chromatography (eluent: $CH_2Cl_2$) to give compound 1 (yield: 18.0 g, 69%). $^1H$ NMR ($CDCl_3$): 0.9 (6H, t), 1.3 (36H, m), 1.7 (4H, m), 4.2 (4H, t), 4.8 (1H, s), 7.2 (1H, d), 7.3 (1H, d), 7.4 (1H, s).

In a two-necked flask under argon, a solution of $Fe(ClO_4)_3$ in methanol (320 mL) was prepared at 0° C. and a dispersion of compound 1 in methanol (120 mL) was added to the solution. After the resultant solution was stirred at 60° C. for 4 hours under argon, the solvent was evaporated under vacuum at room temperature. After water (100 mL) was then added to the residue thus formed, the aqueous layer was extracted with $CH_2Cl_2$ (100 mL×2) and the organic layer was dried and concentrated. The crude product thus obtained was purified by flash chromatography (eluent: $CH_2Cl_2$:hexane=3:2) to give compound 2 (yield: 9.0 g, 50.2%). $^1H$ NMR ($CDCl_3$); 0.9 (12H, t), 1.3 (72H, m), 1.7 (8H, m), 4.2 (8H, t), 7.3 (2H, d), 7.4 (2H, d).

In a one-necked flask, compound 2 (9.0 g, 8.65 mmol) was dispersed in DMF (80 mL). The resultant mixture was stirred at 120° C. for 10 minutes until the solution became clear. After air was purged in the flask, NaI (800 mg) was added and the reaction mixture was refluxed for 24 hours. After the solvent was evaporated under vacuum, water (30 mL) was added to the residue to form a mixture, which was extracted with $CH_2Cl_2$. The organic layers from the extraction were combined, dried, and concentrated. The crude product was purified by flash chromatography (eluent: $CH_2Cl_2$:hexane=7:3) to give compound 3 (yield: 1.75 g, 32.9%). $^1H$ NMR ($CDCl_3$): 0.9 (6H, t), 1.3 (28H, m), 1.4 (4H, m), 1.6 (4H, m), 1.9 (4H, m), 4.6 (4H, t), 7.8 (2H, d), 8.3 (2H, d).

In a two-necked flask, compound 3 (1.75 g, 2.85 mmol) was dissolved in $CH_2Cl_2$ (100 mL). A solution of $Br_2$ (3 eq., 1.37 g, 8.55 mmol) dissolved in 10 mL $CH_2Cl_2$ was added to the above solution dropwise. After the addition was complete, the reaction mixture was stirred at room temperature overnight. A saturated sodium bisulfite solution was then added to the reaction mixture. After the mixture was extracted with $CH_2Cl_2$, the organic layers were combined, dried, and concentrated. The crude product was purified by flash chromatography (eluent: hexane:$CH_2Cl_2$=3:2) to give compound 4, i.e., 2,6-dibromo-didodecyl-4,8-benzodithiophenedicarboxylate (yield: 0.93 g, 42.3%). $^1H$ NMR ($CDCl^3$): 0.9 (6H, t), 1.3 (28H, m), 1.4 (4H, m), 1.6 (4H, m) 1.9 (4H, m), 4.6 (4H, t), 8.3 (2H, s).

Example 2

Synthesis of Polymer 1

2,6-Dibromo-didodecyl-4,8-benzodithiophenedicarboxylate obtained Example 1 (1.6 g; 2.07 mmol) was placed in a two-necked flask and treated with evacuation-argon cycle three times. 300 mL freshly distilled THF was added to the above flask via a cannula and cooled down to −78° C. A 2.85 M solution of n-butyl-lithium in hexane (2.18 mL, 3 eq.; 6.22 mmol) was added dropwise to the above solution at −78° C. After the solution was then stirred at −78° C. for one hour, a 1.0 M trimethyltin chloride in hexane (7.25 mL, 7.25 mmol)

was added in one portion. The reaction mixture was warmed to room temperature and was stirred at room temperature for two hours. The mixture was then quenched by addition of water (200 mL). After the mixture was extracted with diethyl ether three times, the organic layers were combined, washed with a brine solution, dried over anhydrous magnesium sulfate, concentrated at room temperature under high vacuum. The crude bistin product was purified by a short path column chromatography (eluent: 40% dichloromethane in hexane) to give a pure product as a pale yellow solid (1.2 g; 65% yield).

The bistin compound obtained above (150 mg; 0.17 mmol) was placed in a flask covered by an aluminum foil to protect it from a light. After anhydrous toluene (60 mL) was added to the flask via a syringe, the solution was bubbled with argon for 10 minutes. In a two-necked flask, 3,6-dibromo-1,2,4,5-tetrafluorobenzene (48.3 mg, 0.92 eq.; 0.16 mmol), Pd$_2$dba$_3$ (2.5%, 4.26×10$^{-6}$ mol, 3.9 mg), and tri-o-tolyphosphine (20%, 3.41×10$^{-5}$ mol, 10.4 mg) were added and treated with evacuation-argon cycle three times. The bistin compound dissolved in toluene was added to this flask via a syringe and the flask was again treated with evacuation-argon cycle three times. The reaction mixture was then refluxed for 3 days. After cooling to 60° C., an aqueous solution of sodium diethylthiocarbamate trihydrate (4.2 g in 90 mL water) was added to the reaction mixture and the mixture was stirred at 80° C. overnight. After the resultant solution was washed with water three times, the organic layer was poured into 300 mL methanol to form a precipitate. The precipitate was subjected to sequential Soxhlet extractions with methanol, acetone, hexane, dichloromethane, chloroform, and chlorobenzene. The chloroform and chlorobenzene fractions were precipitated again by pouring into methanol. The resultant solids were dried in vacuo to give 150 mg polymer 1. M$_n$ for the major fraction was about 6,000.

Example 3

Synthesis of 1,4-Bis(2-bromo-4,4'-bis(2-ethylhexyl) dithieno[3,2-b:2',3'-dlsilole)-2,3,5,6-tetrafluorobenzene

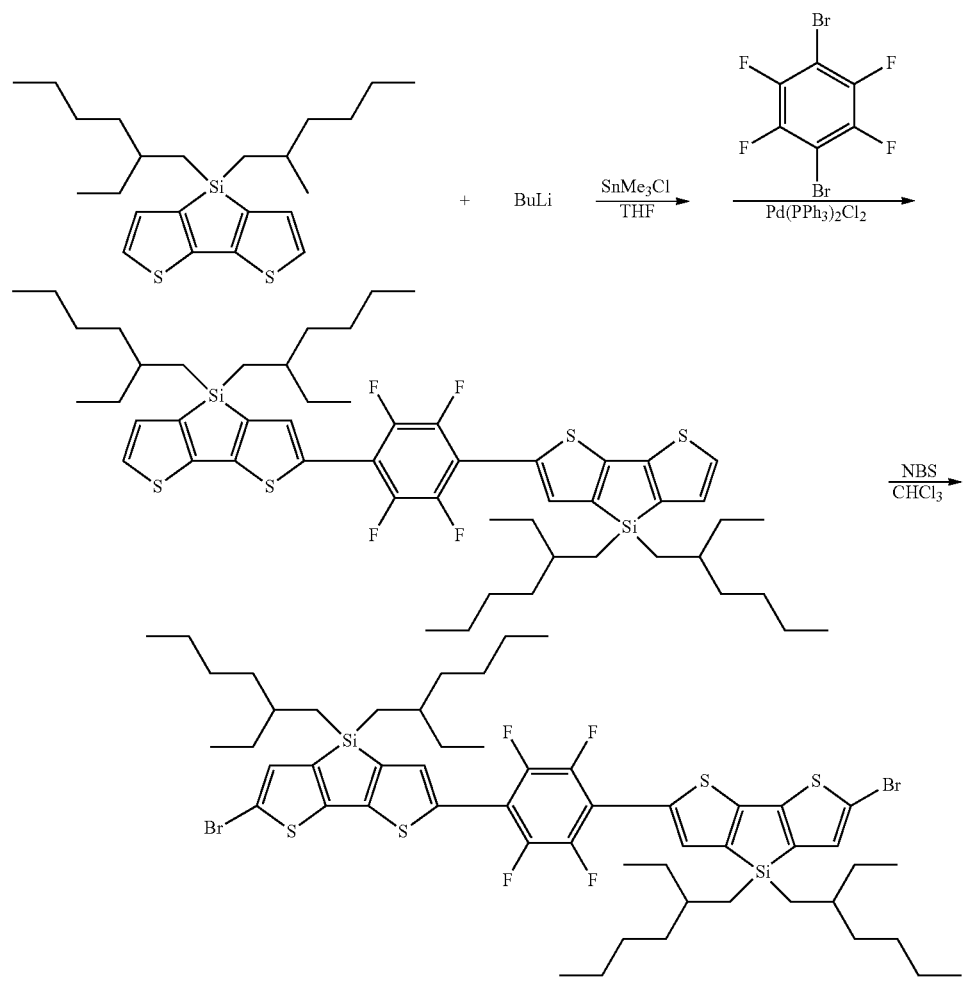

4,4'-bis(2-ethylhexyl)dithieno[3,2-b:2',3'-d]silole (1.68 g, 4.0 mmol) was dissolved in 50 mL of dry THF. After the solution was cooled to −78° C., BuLi (1.40 mL, 4.0 mmol) was added into the solution. After reaction mixture was stirred at −78° C. for 30 minutes, SnMe$_3$Cl (4.0 mL, 4.0 mmol) was added into the reaction flask by syringe. The reaction mixture was then allowed to be warmed to room temperature. 1,4-Dibromo-2,3,5,6-tetrafluorobenzene (0.61 g, 2.0 mmol) and bis(triphenylphosphine)palladium(II) chloride (0.14 g, 0.20 mmol) were dissolved in 5 mL of THF. The resultant solution was then added into the above solution by syringe. The reaction mixture was refluxed then overnight. After the reaction was cooled down, it was quenched by water, and extracted by dichloromethane. The crude product was concentrated by rotary evaporation, and purified by column chromatography to give 1,4-bis(2-bromo-4,4'-bis(2-ethylhexyl)dithieno[3,2-b:2',3'-d]silole)-2,3,5,6-tetrafluorobenzene as yellow oil (1.4 g, 72%).

1,4-Bis(2-bromo-4,4'-bis(2-ethylhexyl)dithieno[3,2-b:2',3'-d]silole)-2,3,5,6-tetrafluorobenzene (0.98 g, 1.0 mmol) obtained above and NBS (0.36 g, 2.0 mmol) were dissolved in 30 mL of chloroform. The solution was refluxed for 1 hour. After the reaction mixture was cooled to room temperature, water was added to quench the reaction. The organic layer was extracted by chloroform to afford a crude product. The crude product was purified by column chromatography to give 1,4-bis(2-bromo-4,4'-bis(2-ethylhexyl)dithieno[3,2-b:2',3'-dlsilole)-2,3,5,6-tetrafluorobenzene as a yellow solid (1.08 g, 95%).

Example 4

Synthesis of 2,5-bis(5-trimethylstannyl-3-tetradecyl-2-thienyl)-thiazolo[5,4-d]thiazole

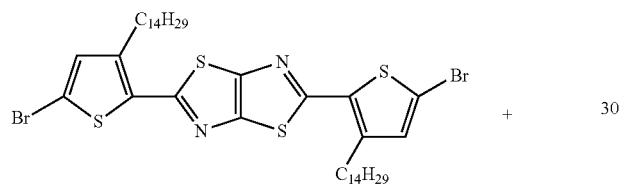

-continued

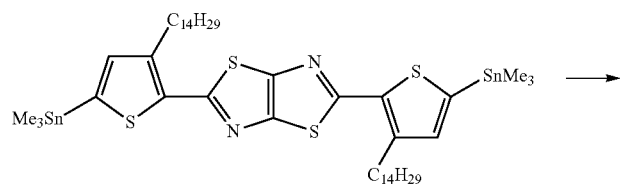

To a 100 mL Schlenk flask was placed 250 mg (0.29 mmol) of 2,5-bis(5-bromo-3-tetradecyl-2-thienyl)-thiazolo[5,4-d]thiazole. The flask was evacuated and refilled with Ar three times, 35 mL of dry THF was added to the flask. The flask was subsequently cooled to −78° C. n-Butyl lithium (0.64 mmol) was then added dropwise to the above solution. After the solution was stirred at −78° C. for 1 hour, 0.7 mL of 1.0 M solution of trimethyl tin chloride was syringed into the reaction mixture. After the solution was allowed to warm up to room temperature, 100 mL of diethyl ether was added to the solution. The solution was washed three times with 100 mL of water and then the organic layer was dried over anhydrous MgSO$_4$. After the solvent was removed in vacuum, 2,5-bis(5-trimethylstannyl-3-tetradecyl-2-thienyl)-thiazolo[5,4-d]thiazole was isolated in quantitative yield.

Example 5

Synthesis of Polymer 3

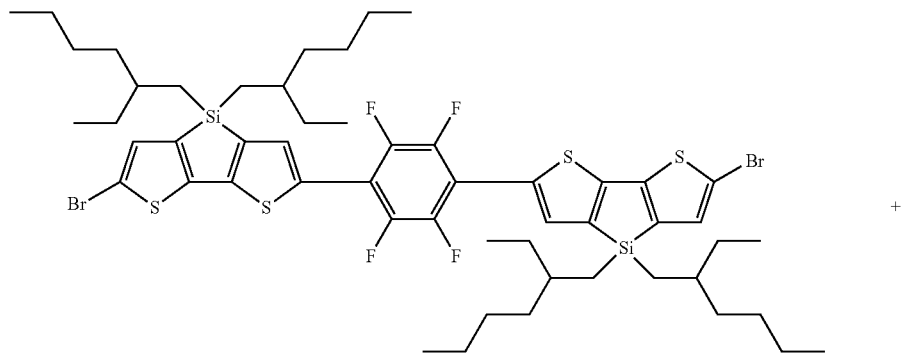

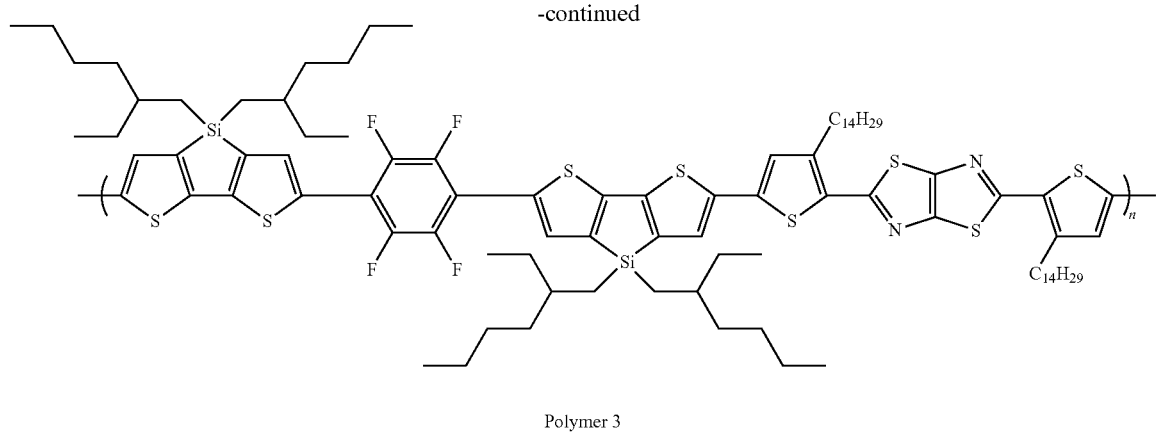

Polymer 3

The 2,5-bis(5-trimethylstannyl-3-tetradecyl-2-thienyl)-thiazolo[5,4-d]thiazole was transferred to a 100 mL three neck round bottom flask. The following reagents were then added to the three neck flask: 7 mg (7 μmol) of Pd$_2$(dba)$_3$, 18 mg (59 μmol) of tri-o-tolyl-phosphine, 332 mg (0.29 mmol) of 1,4-bis(2-bromo-4,4'-bis(2-ethylhexyl)dithieno[3,2-b:2', 3'-d]silole)-2,3,5,6-tetrafluorobenzene, and 20 mL of dry toluene. This reaction mixture was refluxed for two days and then cooled to 80° C. An aqueous solution of sodium diethyldithiocarbamate trihydrate (1.5 g in 20 mL water) was syringed into the flask and the mixture was stirred together at 80° C. for 12 hours. After the mixture was cooled to room temperature, the organic phase was separated from the aqueous layer. The organic layer was poured into methanol (200 mL) to form a polymer precipitate. The polymer precipitate was then collected and purified by soxhlet extraction. The final extraction yielded 123 mg ($M_n$=31 kDa) of poly[1,4-bis(4,4'-bis(2-ethylhexyl)dithieno-[3,2-b:2',3'-d]silole)-2,3,5,6-tetrafluorobenzene-alt-2,5-bis(3-tetradecyl-2-thienyl)-thiazolo[5,4-d]thiazole].

Example 6

Synthesis of Polymer 2

Polymer 2 ($M_n$=41 kDa) was prepared in a manner similar to that described in Example 3 using corresponding monomers.

Example 7

Synthesis of Polymer 4

Polymer 4 ($M_n$=22 kDa) was prepared in a manner similar to that described in Example 3 using corresponding monomers.

Example 8

Measurements of Physical Properties of Polymers 1-4

The HOMO/LUMO values of Polymers 1-4 were measured by cyclic voltammetry. Cyclic voltammetry measurements were performed by drop casting the polymer from an o-dichlorobenzene solution (1 mg/mL) onto a 3.0 mm diameter glassy carbon electrode. The counter electrode was a platinum wire. The reference electrode was Ag/AgNO$_3$ (0.01M) in 0.1M nBu$_4$NPF$_6$/CH3CN which contacted the electrolyte solution using a porous vycor salt bridge filled with electrolyte. The electrolyte solution was 0.1M nBu$_4$NPF$_6$ in acetonitrile. The acetonitrile was Chromasolve grade from Sigma-Aldrich used as received. All electrochemistry was done under high purity argon atmosphere using a BAS100B/W electrochemical analyzer. The scan rate was 20 mV/s with the scan initiated in the oxidative direction. Ferrocene, purified by sublimation, was used as an external reference to convert potentials to the SCE scale. The vacuum level of SCE is assumed to be −4.7 eV. The results were summarized in Table 1 below.

TABLE 1

| Photoactive Polymer | HOMO (eV) | LUMO (eV) | $E_g$(ec)[a] (eV) | $E_g$(opt, soln)[b] (eV) | $E_g$(opt, film)[c] (eV) |
|---|---|---|---|---|---|
| Polymer 1 | −6.1 | −4.05 | 2.05 | 2.10 | — |
| Polymer 2 | −5.42 | −3.72 | 1.7 | 1.70 | 1.69 |
| Polymer 3 | −5.52 | −3.67 | 1.85 | 1.89 | 1.85 |
| Polymer 4 | −5.7 | −3.82 | 1.88 | 1.91 | — |

[a]Bandgap obtained from the cyclic voltammetry measurements described above.
[b]Bandgap obtained from UV-Vis measurements of photoactive polymer solutions.
[c]Bandgap obtained from UV-Vis measurements of photoactive polymer films.

UV-Visible spectra of Polymers 1-4 were acquired on a Perkin-Elmer Lambda35 spectro-photometer. Stock samples of the polymers in o-dichlorobenzene (o-DCB) at a 1 mg/mL concentration were diluted with o-DCB to prepare solutions that gave maximum peak intensity between 0.70 and 0.95 absorbance units. The path length of the quartz cuvettes was 1 cm. The instrument was used in double beam mode with a reference 1 cm quartz cuvette containing o-DCB. HPLC grade (Chromosolv brand from Sigma-Aldrich) o-DCB was used. Spectra were taken at ambient temperature. The results are summarized in Table 2 below.

TABLE 2

| Photoactive Polymer | $\lambda_{max}$ (nm) | $E_g$(opt, soln) (eV) |
|---|---|---|
| Polymer 1 | 486 | 2.10 |
| Polymer 2 | 615,660 | 1.70 |
| Polymer 3 | 570,616 | 1.89 |
| Polymer 4 | 570,615 | 1.91 |

Example 9

Fabrication of Photovoltaic Cells Using Photoactive Polymers 2-4

Photoactive polymers 2-4 were used to fabricate inverted organic photovoltaic cells containing a glass substrate with a transparent pre-patterned indium tin oxide (ITO) bottom electrode, a hole blocking layer on top of the ITO electrode, a photoactive layer on top of the hole blocking layer, a hole carrier layer on top of the photoactive layer, and a top silver electrode. The hole blocking layer contained a crosslinked polyamine and the hole carrier layer contained a thiophene polymer in the HIL family available from Air Products and Chemicals, Inc. The photoactive layer was formed from a blend of a photoactive polymer and PCBM (1:2 by weight) dissolved in 1,2-dichlorobenzene at a concentration of 0.6% by weight by using a blade-coating technique. The photoactive polymer solution was stirred at 80° C. for at least 12 hours before coating. During the blade-coating process, the solution was kept under stirring at 80° C. while the blade-coater temperature was maintained at 50° C. The thickness of the photoactive layer was adjusted by the blade speed and the volume of solution deposited.

The current density-voltage characteristics of the devices were measured as described in Waldauf et al., *Appl. Phys. Lett.*, 89, 233517 (2006). The results are summarized in Table 3 below.

TABLE 3

| Photovoltaic Cell | Conversion Efficiency (%) | Fill Factor (%) | Open-Circuit Voltage (mV) | Short-Circuit Current (mA/cm$^2$) |
|---|---|---|---|---|
| Cell having polymer 2 | 4.46 | 52 | 690 | 12.43 |
| Cell having polymer 3 | 4.56 | 63 | 740 | 9.77 |
| Cell having polymer 4 | 4.91 | 63 | 810 | 9.59 |

Other embodiments are in the claims.

What is claimed is:

1. An article, comprising:
   a first electrode,
   a second electrode, and
   a photoactive material disposed between the first and second electrodes, the photoactive material comprising a polymer of formula (I):

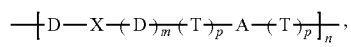

(I)

wherein
   m is 0 or 1;
   each p, independently, is 0, 1, or 2;
   n is an integer greater than 1;
   X is a phenyl moiety substituted with 2-4 halo groups or 2-4 $C_1$-$C_4$ trihaloalkyl groups;
   each D, independently, is a benzodithiophene moiety, a carbazole moiety, a fluorene moiety, a cyclopentadithiophene moiety, or a silacyclopentadithiophene moiety;
   A is a cyclopentadithiazole moiety, a benzothiadiazole moiety, a thiadiazoloquinoxaline moiety, a benzoisothiazole moiety, a benzothiazole moiety, a thienothiophene moiety, a tetrahydroisoindole moiety, a thiazole moiety, a thiazolothiazole moiety, a naphthothiadiazole moiety, a thienopyrazine moiety, an oxazole moiety, an imidazole moiety, a pyrimidine moiety, a benzoxazole moiety, a benzimidazole moiety, a pyridopyrazine moiety, a pyrazinopyridazine moiety, a pyrazinoquinoxaline moiety, a thiadiazolopyridine moiety, a thiadiazolopyridazine moiety, a benzooxadiazole moiety, an oxadiazolopyridine moiety, an oxadiazolopyridazine moiety, a benzoselenadiazole moiety, a benzobisoxazole moiety, a thienothiadiazole moiety, a thienopyrroledione moiety, a tetrazine moiety, a pyrrolopyrroledione moiety, a thiophene moiety, a selenophene moiety, a thiadiazole moiety, a quinoxaline moiety, a benzotriazole moiety, or a furan moiety;
   each T, independently, is a thienothiophene moiety, a thiazole moiety, a thiophene moiety, a selenophene moiety, a thiadiazole moiety, or a furan moiety; and
   the article is configured as a photovoltaic cell.

2. The article of claim 1, wherein
   X is a phenyl moiety of formula (1):

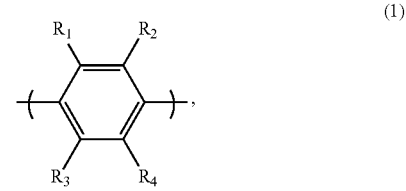

(1)

in which each of $R_1$, $R_2$, $R_3$, and $R_4$, independently, is H, halo, or $C_1$-$C_4$ trihaloalkyl, provided that at least two of $R_1$, $R_2$, $R_3$, and $R_4$ is halo or $C_1$-$C_4$ trihaloalkyl;
   each D, independently, is a benzodithiophene moiety of formula (2), a benzodithiophene moiety of formula (3), a carbazole moiety of formula (12), a fluorene moiety of formula (15), a cyclopentadithiophene moiety of formula (17), a silacyclopentadithiophene moiety of formula (22), or a benzodithiophene moiety of formula (48):

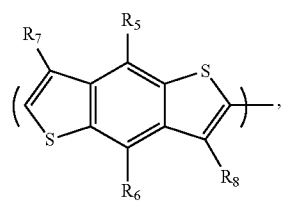

(2)

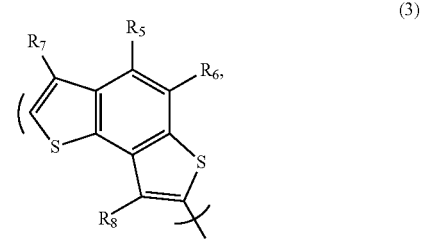

(3)

-continued

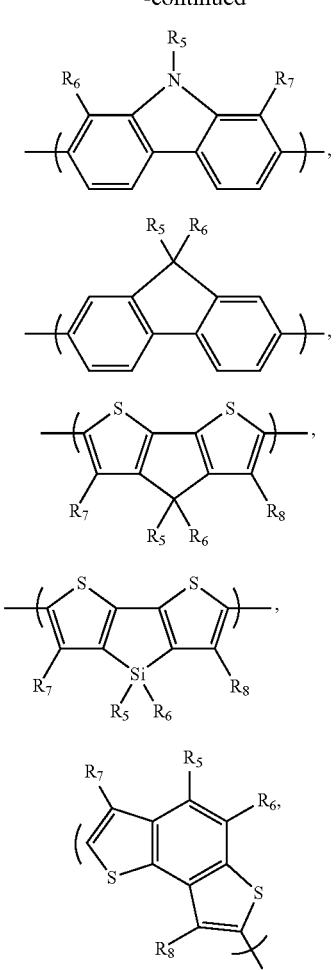

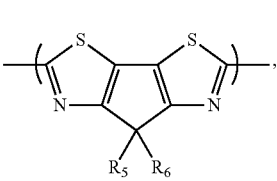

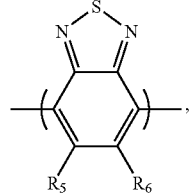

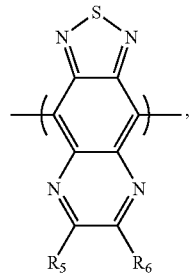

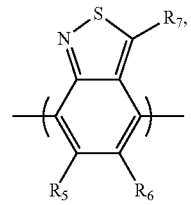

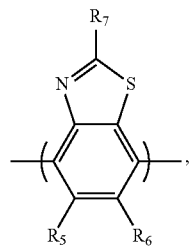

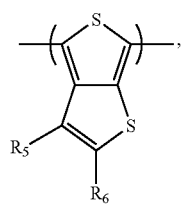

in which each of $R_5$, $R_6$, $R_7$, and $R_8$, independently, is H, halo, $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, OR, COR, COOR, or CON(RR'), in which each of R and R', independently, is H, $C_1$-$C_{24}$ alkyl, aryl, heteroaryl, $C_3$-$C_{24}$ cycloalkyl, or $C_3$-$C_{24}$ heterocycloalkyl; and A is a cyclopentadithiazole moiety of formula (4), a benzothiadiazole moiety of formula (5), a thiadiazoloquinoxaline moiety of formula (6), a benzoisothiazole moiety of formula (7), a benzothiazole moiety of formula (8), a thienothiophene moiety of formula (10), a thienothiophene moiety of formula (11), a tetrahydroisoindole moiety of formula (14), a thiazole moiety of formula (18), a thiazolothiazole moiety of formula (19), a naphthothiadiazole moiety of formula (20), a thienopyrazine moiety of formula (21), an oxazole moiety of formula (23), an imidazole moiety of formula (24), a pyrimidine moiety of formula (25), a benzoxazole moiety of formula (26), a benzimidazole moiety of formula (27), a pyridopyrazine moiety of formula (28), a pyrazinopyridazine moiety of formula (29), a pyrazinoquinoxaline moiety of formula (30), a thiadiazolopyridine moiety of formula (31), a thiadiazolopyridazine moiety of formula (32), a benzooxadiazole moiety of formula (33), an oxadiazolopyridine moiety of formula (34), an oxadiazolopyridazine moiety of formula (35), a benzoselenadiazole moiety of formula (36), a benzobisoxazole moiety of formula (37), a benzobisoxazole moiety of formula (38), a thienothiadiazole moiety of formula (39), a thienopyrroledione moiety of formula (40), a tetrazine moiety of formula (41), a pyrrolopyrroledione moiety of formula (42), a thiophene moiety of formula (43), a selenophene moiety of formula (44), a thiadiazole moiety of formula (45), a quinoxaline moiety of formula (46), a benzotriazole moiety of formula (47), or a furan moiety of formula (49):

(11) 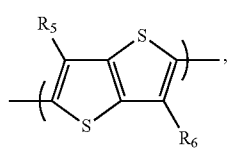
(14) 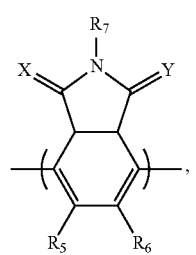
(18) 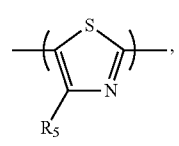
(19) 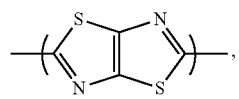
(20) 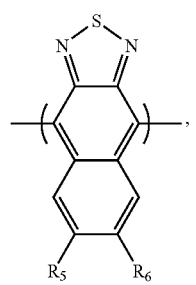
(21) 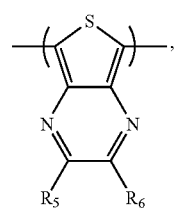
(23) 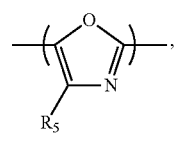
(24) 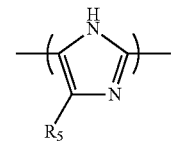
(25) 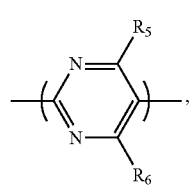
(26) 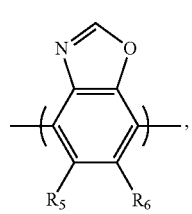
(27) 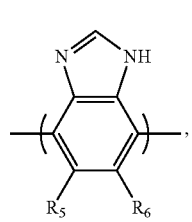
(28) 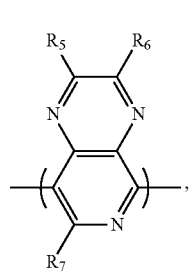
(29) 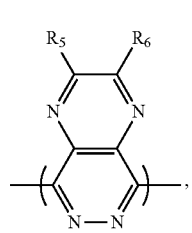
(30) 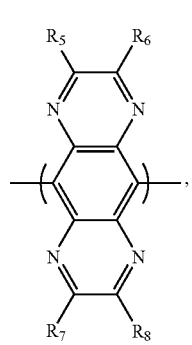
(31) 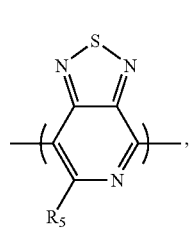
(32) 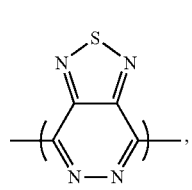

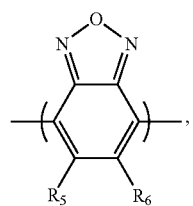 (33)

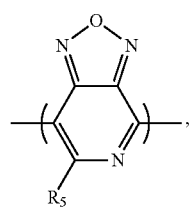 (34)

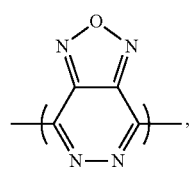 (35)

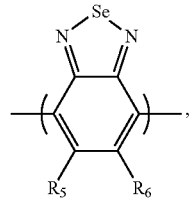 (36)

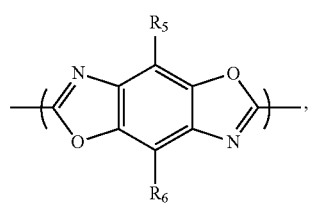 (37)

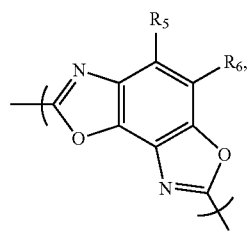 (38)

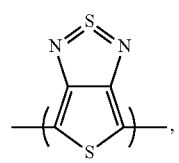 (39)

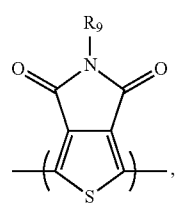 (40)

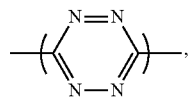 (41)

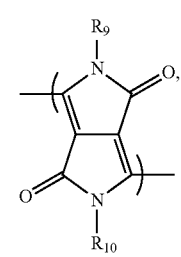 (42)

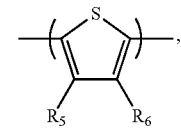 (43)

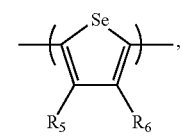 (44)

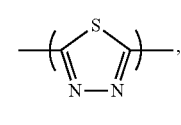 (45)

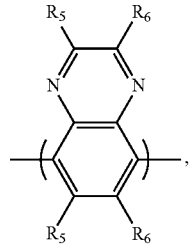 (46)

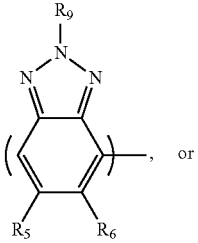 (47) or

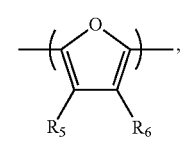 (49)

in which each of X and Y, independently, is $CH_2$, O, or S; each of $R_5$, $R_6$, $R_7$, and $R_8$, independently, is H, halo, $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, CN, OR, COR, COOR, or CON(RR'), in which each of R and R', independently, is H, $C_1$-$C_{24}$ alkyl, aryl, heteroaryl, $C_3$-$C_{24}$ cycloalkyl, or $C_3$-$C_{24}$ heterocycloalkyl; and each of $R_9$ and $R_{10}$, independently, is H, $C_1$-$C_{24}$ alkyl, aryl, heteroaryl, $C_3$-$C_{24}$ cycloalkyl, or $C_3$-$C_{24}$ heterocycloalkyl;

each T, independently, is a thienothiophene moiety of formula (10), a thienothiophene moiety of formula (11), a thiazole moiety of formula (18), a thiophene moiety of formula (43), a selenophene moiety of formula (44), a thiadiazole moiety of formula (45), or a furan moiety of formula (49):

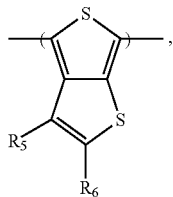
(10)

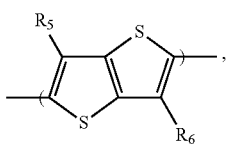
(11)

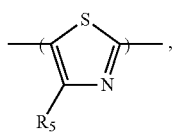
(18)

-continued

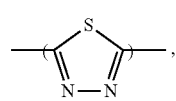
(45)

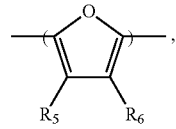
(49)

wherein each of $R_5$ and $R_6$, independently, is H, halo, $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, CN, OR, COR, COOR, or CON(RR'), in which each of R and R', independently, is H, $C_1$-$C_{24}$ alkyl, aryl, heteroaryl, $C_3$-$C_{24}$ cycloalkyl, or $C_3$-$C_{24}$ heterocycloalkyl.

3. The article of claim 2, wherein m is 1, and each p is 0 or 1.

4. The article of claim 3, wherein each of $R_1$, $R_2$, $R_3$, and $R_4$, independently, is halo.

5. The article of claim 4, wherein each of $R_1$, $R_2$, $R_3$, and $R_4$ is fluoro.

6. The article of claim 5, wherein each D, independently, is the silacyclopentadithiophene moiety of formula (22), in which each of $R_5$, $R_6$, $R_7$, and $R_8$, independently, is H or $C_1$-$C_{24}$ alkyl.

7. The article of claim 6, wherein each D is the silacyclopentadithiophene moiety of formula (22), in which each of $R_5$ and $R_6$ is $C_8H_{17}$ alkyl, and each of $R_7$ and $R_8$ is H.

8. The article of claim 6, wherein A is the benzothiadiazole moiety of formula (5) or the thiazolothiazole moiety of formula (19), in which each of $R_5$ and $R_6$ is H.

9. The article of claim 8, wherein the polymer is

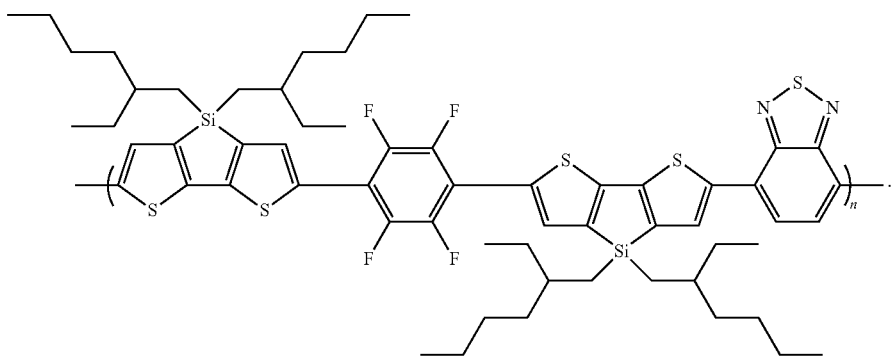

-continued

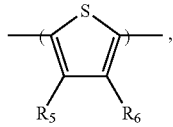
(43)

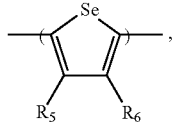
(44)

10. The article of claim 8, wherein each p is 1 and each T, independently, is the thiophene moiety of formula (43), in which each of $R_5$ and $R_6$, independently, is H, halo, or $C_1$-$C_{24}$ alkyl.

11. The article of claim 10, wherein each p is 1 and each T, independently, is the thiophene moiety of formula (43), in which each of $R_5$ and $R_6$, independently, is H, Cl, or $C_{14}H_{29}$ alkyl.

12. The article of claim 11, wherein the polymer is

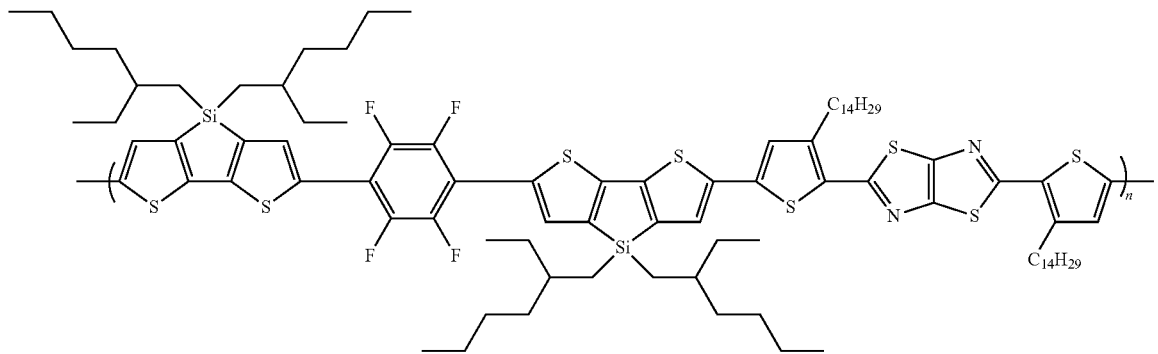

or

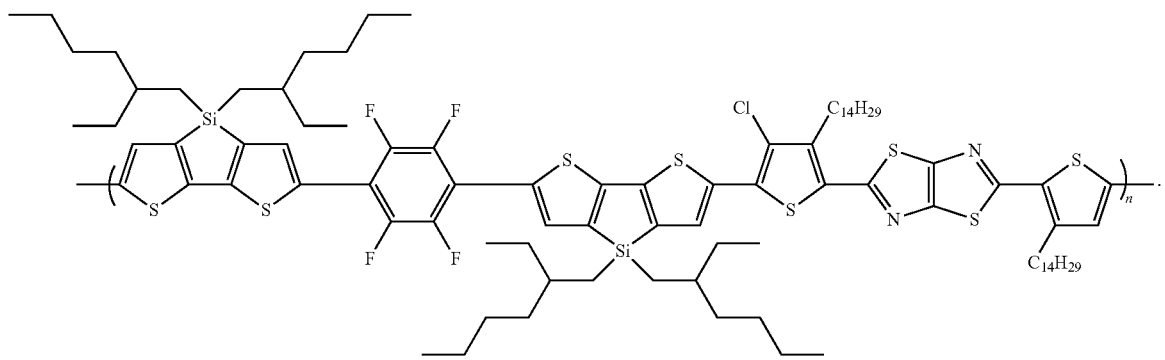

.

13. A polymer of formula (I):

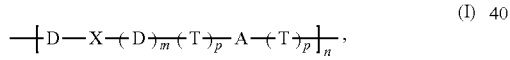

wherein
m is 0 or 1;
each p, independently, is 0, 1, or 2;
n is an integer greater than 1;
X is a phenyl moiety substituted with 2-4 halo groups or 2-4 $C_1$-$C_4$ trihaloalkyl groups;
each D, independently, is a benzodithiophene moiety, a carbazole moiety, a fluorene moiety, a cyclopentadithiophene moiety, or a silacyclopentadithiophene moiety;
A is a cyclopentadithiazole moiety, a benzothiadiazole moiety, a thiadiazoloquinoxaline moiety, a benzoisothiazole moiety, a benzothiazole moiety, a thienothiophene moiety, a tetrahydroisoindole moiety, a thiazole moiety, a thiazolothiazole moiety, a naphthothiadiazole moiety, a thienopyrazine moiety, an oxazole moiety, an imidazole moiety, a pyrimidine moiety, a benzoxazole moiety, a benzimidazole moiety, a pyridopyrazine moiety, a pyrazinopyridazine moiety, a pyrazinoquinoxaline moiety, a thiadiazolopyridine moiety, a thiadiazolopyridazine moiety, a benzooxadiazole moiety, an oxadiazolopyridine moiety, an oxadiazolopyridazine moiety, a benzoselenadiazole moiety, a benzobisoxazole moiety, a thienothiadiazole moiety, a thienopyrroledione moiety, a tetrazine moiety, a pyrrolopyrroledione moiety, a thiophene moiety, a selenophene moiety, a thiadiazole moiety, a quinoxaline moiety, a benzotriazole moiety, or a furan moiety; and
each T, independently, is a thienothiophene moiety, a thiazole moiety, a thiophene moiety, a selenophene moiety, a thiadiazole moiety, or a furan moiety.

14. The polymer of claim 13, wherein
X is a phenyl moiety of formula (1):

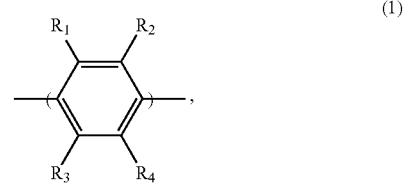

in which each of $R_1$, $R_2$, $R_3$, and $R_4$, independently, is H, halo, or $C_1$-$C_4$ trihaloalkyl, provided that at least two of $R_1$, $R_2$, $R_3$, and $R_4$ is halo or $C_1$-$C_4$ trihaloalkyl;
each D, independently, is a benzodithiophene moiety of formula (2), a benzodithiophene moiety of formula (3), a carbazole moiety of formula (12), a fluorene moiety of formula (15), a cyclopentadithiophene moiety of formula (17), a silacyclopentadithiophene moiety of formula (22), or a benzodithiophene moiety of formula (48):

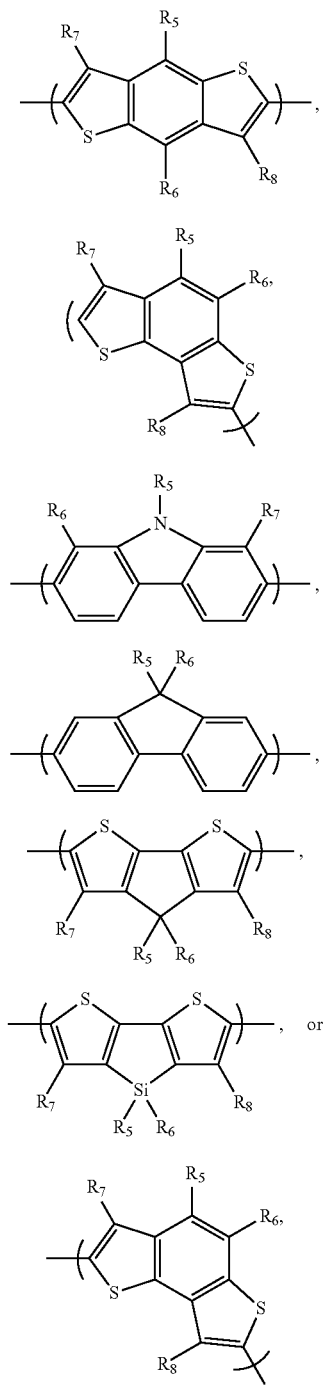

droisoindole moiety of formula (14), a thiazole moiety of formula (18), a thiazolothiazole moiety of formula (19), a naphthothiadiazole moiety of formula (20), a thienopyrazine moiety of formula (21), an oxazole moiety of formula (23), an imidazole moiety of formula (24), a pyrimidine moiety of formula (25), a benzoxazole moiety of formula (26), a benzimidazole moiety of formula (27), a pyridopyrazine moiety of formula (28), a pyrazinopyridazine moiety of formula (29), a pyrazinoquinoxaline moiety of formula (30), a thiadiazolopyridine moiety of formula (31), a thiadiazolopyridazine moiety of formula (32), a benzooxadiazole moiety of formula (33), an oxadiazolopyridine moiety of formula (34), an oxadiazolopyridazine moiety of formula (35), a benzoselenadiazole moiety of formula (36), a benzobisoxazole moiety of formula (37), a benzobisoxazole moiety of formula (38), a thienothiadiazole moiety of formula (39), a thienopyrroledione moiety of formula (40), a tetrazine moiety of formula (41), a pyrrolopyrroledione moiety of formula (42), a thiophene moiety of formula (43), a selenophene moiety of formula (44), a thiadiazole moiety of formula (45), a quinoxaline moiety of formula (46), a benzotriazole moiety of formula (47), or a furan moiety of formula (49):

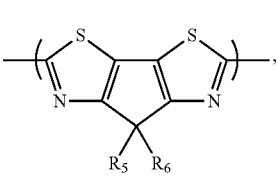

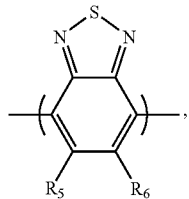

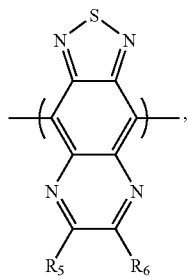

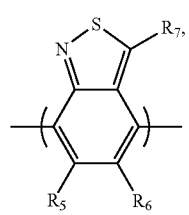

in which each of $R_5$, $R_6$, $R_7$, and $R_8$, independently, is H, halo, $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, CN, OR, COR, COOR, or CON(RR'), in which each of R and R', independently, is H, $C_1$-$C_{24}$ alkyl, aryl, heteroaryl, $C_3$-$C_{24}$ cycloalkyl, or $C_3$-$C_{24}$ heterocycloalkyl; and A is a cyclopentadithiazole moiety of formula (4), a benzothiadiazole moiety of formula (5), a thiadiazoloquinoxaline moiety of formula (6), a benzoisothiazole moiety of formula (7), a benzothiazole moiety of formula (8), a thienothiophene moiety of formula (10), a thienothiophene moiety of formula (11), a tetrahy-

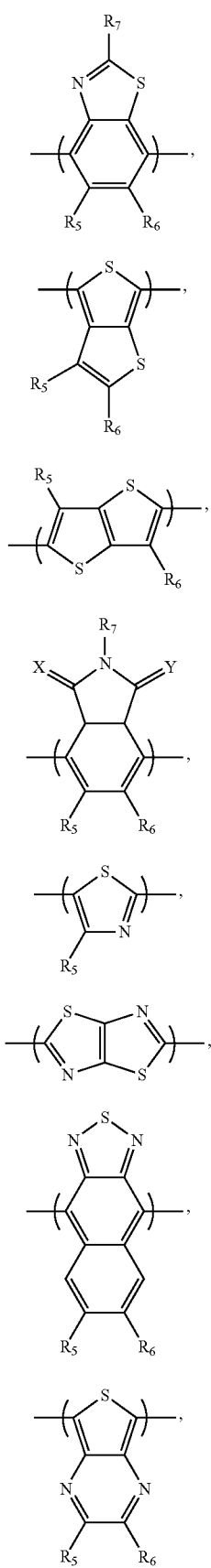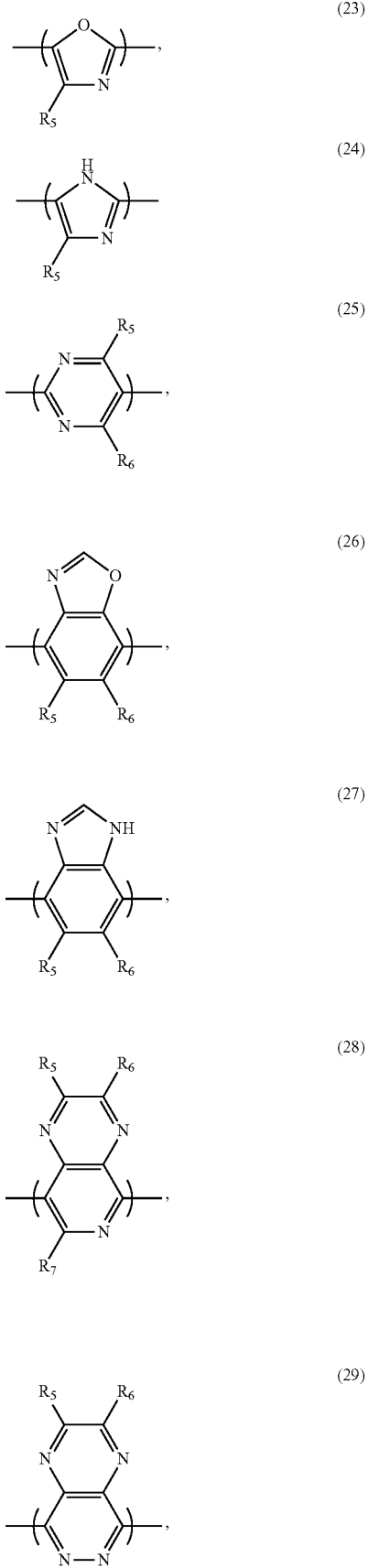

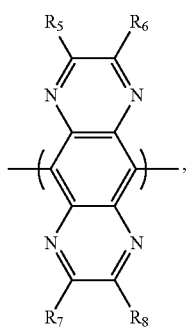
(30)
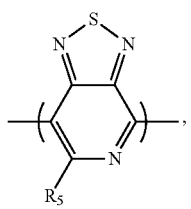
(31)
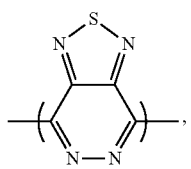
(32)
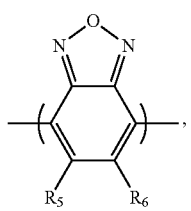
(33)
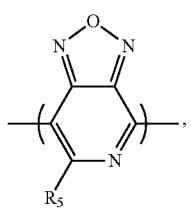
(34)
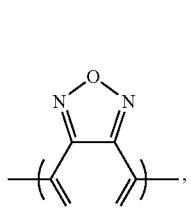
(35)
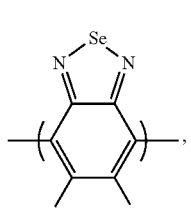
(36)
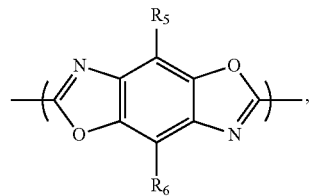
(37)
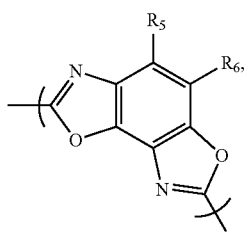
(38)
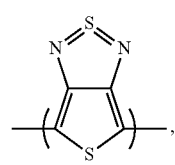
(39)
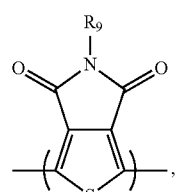
(40)
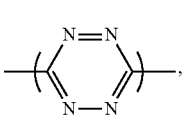
(41)
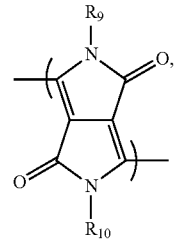
(42)
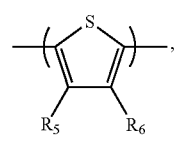
(43)
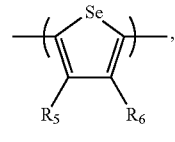
(44)
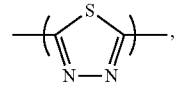
(45)

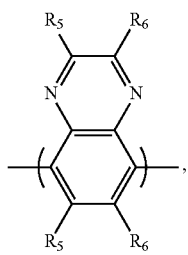
(46)

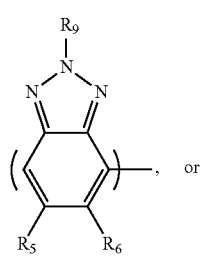
(47)

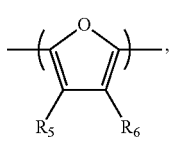
(49)

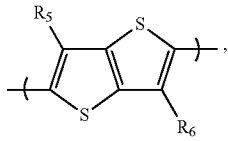
(11)

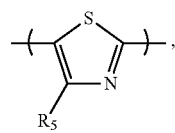
(18)

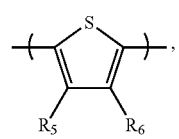
(43)

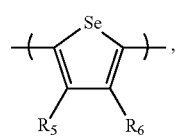
(44)

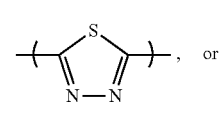
(45)

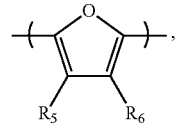
(49)

in which each of X and Y, independently, is $CH_2$, O, or S; each of $R_5$, $R_6$, $R_7$, and $R_8$, independently, is H, halo, $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, CN, OR, COR, COOR, or CON(RR'), in which each of R and R', independently, is H, $C_1$-$C_{24}$ alkyl, aryl, heteroaryl, $C_3$-$C_{24}$ cycloalkyl, or $C_3$-$C_{24}$ heterocycloalkyl; and each of $R_9$ and $R_{10}$, independently, is H, $C_1$-$C_{24}$ alkyl, aryl, heteroaryl, $C_3$-$C_{24}$ cycloalkyl, or $C_3$-$C_{24}$ heterocycloalkyl;

each T, independently, is a thienothiophene moiety of formula (10), a thienothiophene moiety of formula (11), a thiazole moiety of formula (18), a thiophene moiety of formula (43), a selenophene moiety of formula (44), a thiadiazole moiety of formula (45), or a furan moiety of formula (49):

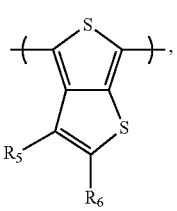
(10)

wherein each of $R_5$ and $R_6$, independently, is H, halo, $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, CN, OR, COR, COOR, or CON(RR'), in which each of R and R', independently, is H, $C_1$-$C_{24}$ alkyl, aryl, heteroaryl, $C_3$-$C_{24}$ cycloalkyl, or $C_3$-$C_{24}$ heterocycloalkyl.

15. The polymer of claim 14, wherein m is 1, and each p is 0 or 1.

16. The polymer of claim 15, wherein each of $R_1$, $R_2$, $R_3$, and $R_4$, independently, is halo.

17. The polymer of claim 16, wherein each of $R_1$, $R_2$, $R_3$, and $R_4$ is fluoro.

18. The polymer of claim 17, wherein each D, independently, is the silacyclopentadithiophene moiety of formula (22), in which each of $R_5$, $R_6$, $R_7$, and $R_8$, independently, is H or $C_1$-$C_{24}$ alkyl.

19. The polymer of claim 18, wherein each D is the silacyclopentadithiophene moiety of formula (22), in which each of $R_5$ and $R_6$ is $C_8H_{17}$ alkyl, and each of $R_7$ and $R_8$ is H.

20. The polymer of claim 18, wherein A is the benzothiadiazole moiety of formula (5) or the thiazolothiazole moiety of formula (19), in which each of $R_5$ and $R_6$ is H.

21. The polymer of claim 20, wherein the polymer is

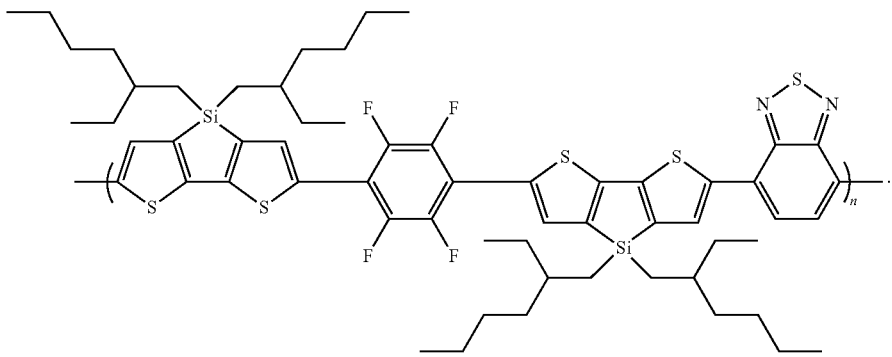

22. The polymer of claim 20, wherein each p is 1 and each T, independently, is the thiophene moiety of formula (43), in which each of $R_5$ and $R_6$, independently, is H, halo, or $C_1$-$C_{24}$ alkyl.

23. The polymer of claim 22, wherein each p is 1 and each T, independently, is the thiophene moiety of formula (43), in which each of $R_5$ and $R_6$, independently, is H, Cl, or $C_{14}H_{29}$ alkyl.

24. The polymer of claim 23, wherein the polymer is

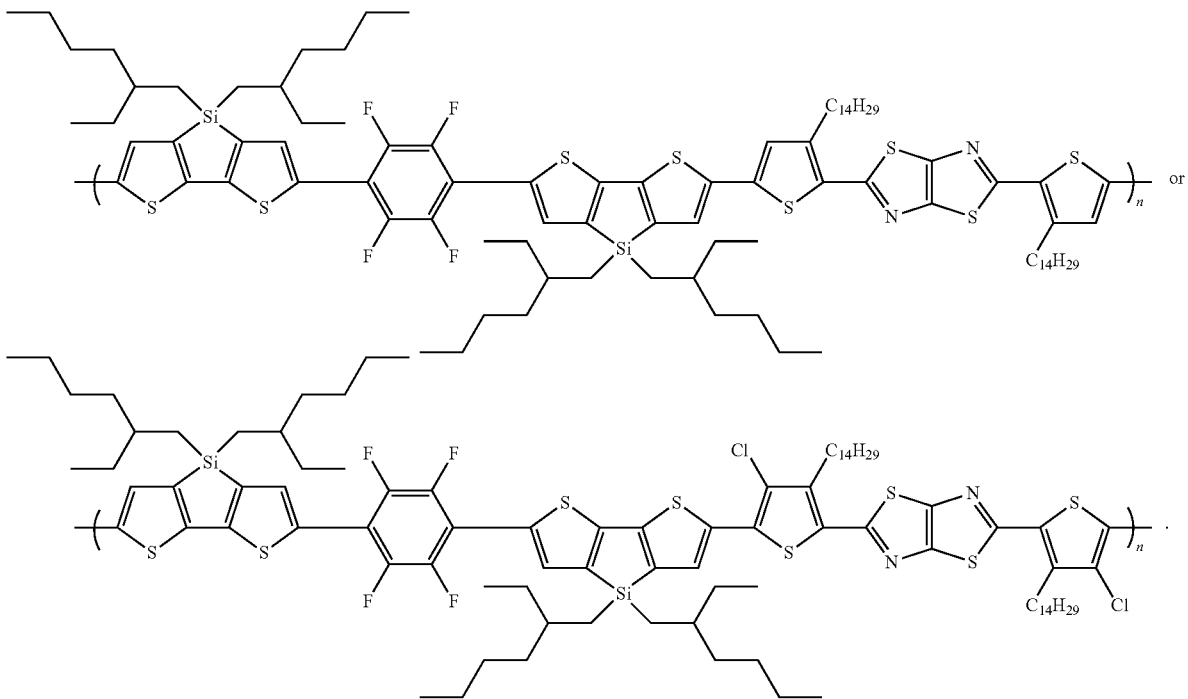

* * * * *